United States Patent
Shim et al.

(10) Patent No.: US 9,653,181 B1
(45) Date of Patent: May 16, 2017

(54) SMART SELF-REPAIR DEVICE AND METHOD OF SELF-REPAIRING A PACKAGE

(71) Applicant: SK hynix Inc., Icheon-si, Gyeonggi-do (KR)

(72) Inventors: Young Bo Shim, Dangjin-si (KR); Joo Hyeon Lee, Bucheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/161,606

(22) Filed: May 23, 2016

(30) Foreign Application Priority Data

Jan. 25, 2016 (KR) .................. 10-2016-0008681

(51) Int. Cl.
| | |
|---|---|
| *G11C 29/12* | (2006.01) |
| *G11C 29/00* | (2006.01) |
| *G11C 7/16* | (2006.01) |
| *G11C 17/18* | (2006.01) |
| *G11C 29/04* | (2006.01) |
| *G11C 29/08* | (2006.01) |

(52) U.S. Cl.
CPC ............ *G11C 29/12* (2013.01); *G11C 7/16* (2013.01); *G11C 17/18* (2013.01); *G11C 29/04* (2013.01); *G11C 29/08* (2013.01); *G11C 29/78* (2013.01); *G11C 2029/0407* (2013.01)

(58) Field of Classification Search
CPC . G11C 29/04; G11C 2029/0407; G11C 29/08; G11C 29/12
See application file for complete search history.

(56) References Cited

U.S. PATENT DOCUMENTS

| | | | | |
|---|---|---|---|---|
| 6,388,929 B1* | 5/2002 | Shimano | ............... | G11C 29/44 365/200 |
| 6,421,286 B1 | 7/2002 | Ohtani et al. | | |
| 7,245,542 B2* | 7/2007 | Park | .................. | G11C 29/12 365/201 |
| 7,940,587 B2* | 5/2011 | Kubouchi | ............ | G11C 29/025 365/191 |
| 8,000,158 B2* | 8/2011 | Lee | ..................... | G11C 29/24 365/200 |
| 8,059,477 B2* | 11/2011 | Yoon | ..................... | G11C 17/18 365/120 |
| 8,120,972 B2* | 2/2012 | Kim | ..................... | G11C 29/40 365/189.07 |

(Continued)

*Primary Examiner* — Vanthu Nguyen
(74) *Attorney, Agent, or Firm* — William Park & Associates Ltd.

(57) ABSTRACT

A smart self-repair device and method of self-repairing a package is disclosed. The smart self-repair device may include a fuse array configured to store information regarding respective bits of a fail address in fuses. The smart self-repair device may include a self-repair control circuit configured to control repairing of not only a target mat in which a fail occurs, but also adjacent upper and lower mats sharing a sense amplifier along with the target mat, and to output fail address information corresponding to a fail mode, and row fuse set information or a column fuse set information. The smart self-repair device may include a data control circuit configured to output repair information to the fuse array based on the fail address information and the row fuse set information or the column fuse set information, and may include a control circuit configured to control a rupture operation of the fuse array.

26 Claims, 11 Drawing Sheets

(56) References Cited

U.S. PATENT DOCUMENTS

| | | | |
|---|---|---|---|
| 8,194,482 B2* | 6/2012 | Kang | G11C 29/02 |
| | | | 365/201 |
| 8,737,146 B2* | 5/2014 | Kim | G11C 17/16 |
| | | | 365/200 |
| 2003/0028834 A1* | 2/2003 | Brown | G11C 29/808 |
| | | | 714/711 |
| 2014/0146624 A1 | 5/2014 | Son et al. | |
| 2015/0134895 A1 | 5/2015 | Sohn et al. | |
| 2016/0351276 A1 | 12/2016 | Shim | |

* cited by examiner

SMART SELF-REPAIR DEVICE AND METHOD OF SELF-REPAIRING A PACKAGE

CROSS-REFERENCE TO RELATED APPLICATION

This application claims priority based upon Korean patent application No. 10-2016-0008681, filed on Jan. 25, 2016, the disclosure of which is hereby incorporated in its entirety by reference herein.

BACKGROUND

1. Technical Field

Embodiments of the present disclosure relate to a smart self-repair device and method of self-repairing a package, and more particularly to a technology regarding repair efficiency in a package repair operation.

2. Related Art

A Dynamic Random Access Memory (DRAM) is constructed by a plurality of memory cells which are arranged in the form of a matrix. If a fail occurs even in one memory cell among a plurality of memory cells, a semiconductor memory device is classified as a bad product since it cannot perform an operation properly. According to high integration and high speed operation of a semiconductor memory device, the probability of a failed cell to occur increases.

Therefore, a yield, defined as the ratio of the number of good chips to the total number of chips, serves to determine a manufacturing cost that is likely to decrease. Thus, research has actively been made for not only a method for high integration and high speed operation of a semiconductor memory device but also a method for efficiently repairing a failed cell in an effort to increase a yield.

As a method for repairing a failed cell, a technology of building in a repair circuit for replacing a failed cell with a redundancy cell is being used. In general, a repair circuit includes redundancy columns/rows which are arranged in columns and rows each constructed by redundancy memory cells. A redundancy column/row is selected instead of a column/row in which a fail has occurred.

That is to say, if a row and/or column address signal which designates a failed cell is input, a redundancy column/row is selected instead of a failed column/row of a normal memory cell bank.

Generally, in order to represent an address which designates a failed cell, a plurality of fuses to be cut are disposed. The address of the failed cell is programmed as the plurality of fuses are selectively cut.

Currently, in a DRAM, methods for repairing a failed cell are divided into a repair method in a wafer state and a repair method in a package state.

The wafer repair method is a method for performing a test and then replacing a failed cell with a redundancy cell at a wafer level. The package repair method is a method for performing a test and then replacing a failed cell with a redundancy cell at a package state.

In a conventional package self-repair mode, a repair operation is performed by using only a row redundancy, and a column redundancy is not used. Therefore, in the case where a column-oriented fail occurs, it is impossible to repair the fail, and a package yield cannot help but decrease.

Moreover, in order for saturation of package yield, wafer test conditions should be diversified, and a package yield checking process should be repeated a multitude of times. In such a situation, a yield ramp-up time lengthens, and multiple numbers of experimental equipment is needed.

SUMMARY

In accordance with an embodiment of the present disclosure, a smart self-repair device may be provided. The smart self-repair device may include a fuse array configured to store information regarding respective bits of a fail address in fuses. The smart self-repair device may include a self-repair control circuit configured to control repairing of not only a target mat in which a fail occurs, but also adjacent upper and lower mats sharing a sense amplifier along with the target mat, and to output fail address information corresponding to a fail mode, and row fuse set information or a column fuse set information. The smart self-repair device may include a data control circuit configured to output repair information to the fuse array based on the fail address information and the row fuse set information or the column fuse set information. The smart self-repair device may include a control circuit configured to control a rupture operation of the fuse array.

In accordance with an embodiment of the present disclosure, a method of self-repairing a package may be provided. The method may include storing information regarding respective bits of a fail address in fuses. The method may include controlling a repair of not only a target mat in which a fail occurs, bit also adjacent upper and lower mats sharing a sense amplifier along with the target mat, and to output fail address information corresponding to a fail mode, and row fuse set information or a column fuse set information. The method may include outputting repair information to the fuse array based on the fail address information and the row fuse set information or the column fuse set information. The method may include controlling a rupture operation of the fuse array.

DESCRIPTION OF EMBODIMENTS

Various embodiments of the present disclosure may be directed to providing a smart self-repair device that substantially obviates one or more problems due to limitations and disadvantages of the related art.

An embodiment of the present disclosure may relate to a technology for analyzing a fail mode and performing a redundancy operation according to the fail mode in a smart self-repair operation, thereby improving repair efficiency.

Reference will now be made to the embodiments of the present disclosure, examples of which are illustrated in the accompanying drawings. Wherever possible, the same reference numbers will be used throughout the drawings to refer to the same or like parts. Hereinafter, a smart self-repair device according to embodiments of the present disclosure will be described below with reference to the accompanying drawings through various examples of embodiments.

In accordance with an embodiment of the present disclosure, in order to perform self-repair, if fails occur during a test, row addresses and column addresses for initially inputted different 3 fail bits may be respectively stored in corresponding registers.

Thereafter, fail bits which additionally occur are respectively compared with the already stored row addresses and column addresses for the 3 fail bits. If the address of a fail bit is the same as the address stored in a register, the multi-bit counter of the corresponding row address or column address stored in the register is increased. Conversely, if the address of a fail bit is different from the address stored in a register, failed cell information is gathered in such a way as to discard fail information.

Subsequently, when the test is ended, row address multi-bit counters and column address multi-bit counters are analyzed. It may be determined that the 3 fails stored in the registers are single bit fails, row-oriented fails, column-oriented fails or cluster-oriented fails. Row-oriented fails may be repaired using row redundancies, and column-oriented fails may be repaired using column redundancies. Further, the remaining fails may be repaired by selecting row redundancies or column redundancies in which fuse sets are left. Therefore, when self-repair of a package is performed by applying an embodiment, since various fail modes may be repaired, not only a package yield may be improved, but also a yield ramp-up time may be shortened.

Figure 1:
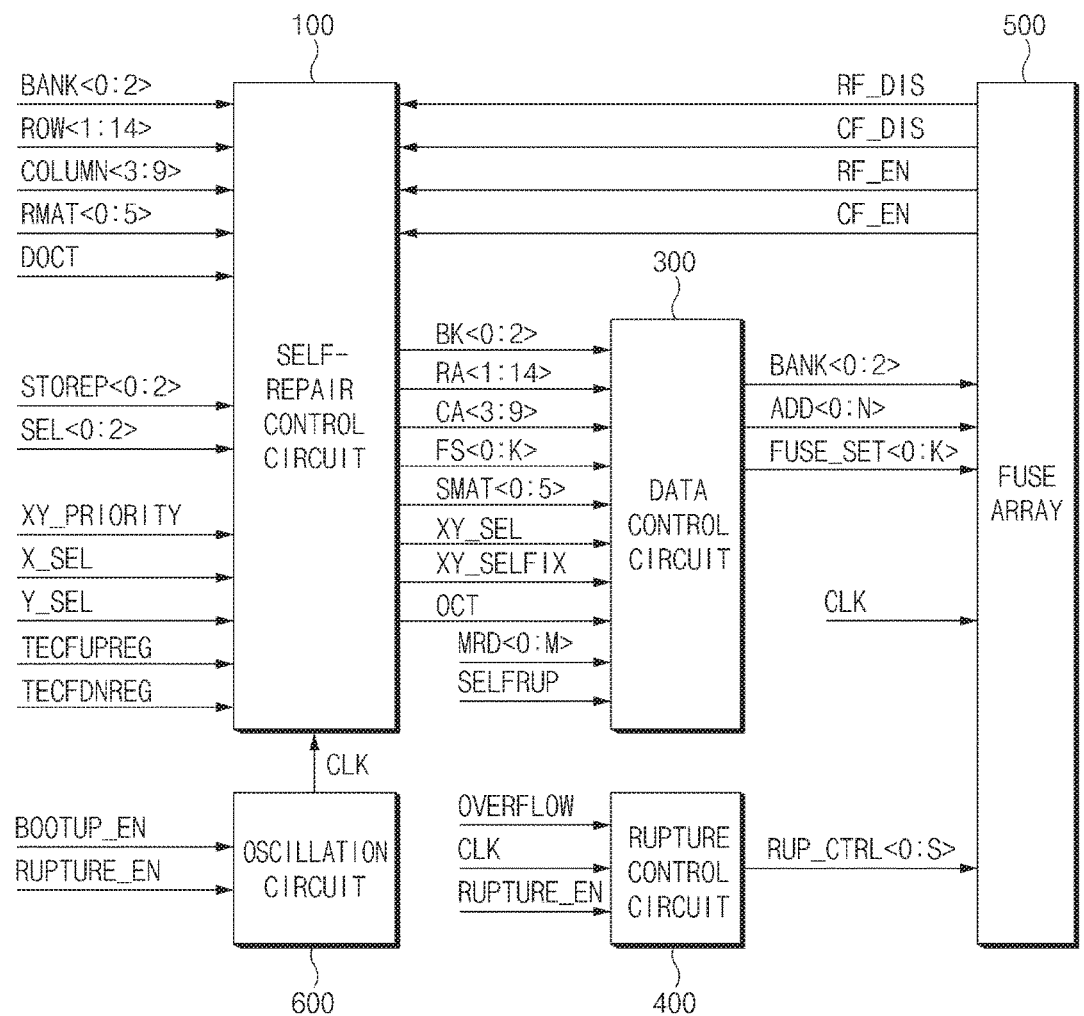
FIG. 1 is a block diagram illustrating a representation of an example of a smart self-repair device according to an embodiment of the present disclosure.

FIG. 1 is a block diagram illustrating a representation of an example of a smart self-repair device according to an embodiment of the present disclosure.

Referring to FIG. 1, the smart self-repair device according to an embodiment includes a self-repair control circuit 100, a data control circuit 300, a rupture control circuit 400, a fuse array 500, and an oscillation circuit 600. In this case, the fuse array 500 may include an array rupture electrical fuse (ARE) array 500.

The self-repair control circuit 100 controls a self-repair operation by receiving bank addresses BANK<0:2>, row addresses ROW<1:14>, column addresses COLUMN<3:9>, mat addresses RMAT<0:5>, a fail region identification signal DOCT, storage signals STOREP<0:2>, selection signals SEL<0:2>, a redundancy control signal XY_PRIORITY, a row redundancy selection signal X_SEL, a column redundancy selection signal Y_SEL, an upper selection signal TECFUPREG, a lower selection signal TECFDNREG, a clock signal CLK, row fuse set signals (RF_EN, RF_DIS), and column fuse set signals (CF_EN, CF_DIS).

The bank addresses BANK<0:2> are bit signals which represent a bank where a failed memory cell is positioned in a function test, among a plurality of banks (for example, 8 banks). The row addresses ROW<1:14> represent the address information of a failed memory cell. The column addresses COLUMN<3:9> represent the address information of the failed memory cell.

The storage signals STOREP<0:2> are pulse signals for sequentially storing a corresponding row address and a corresponding column address in each of 3 row/column address registers whenever a memory cell fails. The selection signals SEL<0:2> are signals which are used to optionally select one among the 3 row/column address registers, to perform repair after the function test is ended.

The redundancy control signal XY_PRIORITY is a signal for setting priority between a row redundancy and a column redundancy. For example, if the redundancy control signal XY_PRIORITY is a low level, a row redundancy is used with priority. If the redundancy control signal XY_PRIORITY is a high level, a column redundancy is used with priority. The case where a column redundancy is used with priority may be applied when repairing a single bit fail or a cluster-oriented fail.

The row redundancy selection signal X_SEL is a signal which is used to set a repair mode selection signal XY_SEL to a low level. In other words, the row redundancy selection signal X_SEL is set to a low level when performing repair using only a row redundancy.

The column redundancy selection signal Y_SEL is a signal which is used to set the repair mode selection signal XY_SEL to a high level. In other words, the column redundancy selection signal Y_SEL is transitioned from a low level to a high level when performing repair using only a column redundancy.

The self-repair control circuit 100 outputs bank signals BK<0:2>, fail row addresses RA<1:14>, fail column addresses CA<3:9>, fuse set signals FS<0:K>, column region identification signals OCT<0:7>, mat selection signals SMAT<0:5>, a repair mode selection signal XY_SEL, and a fail mode signal XY_SELFIX to the data control circuit 300.

The bank signals BK<0:2> are the bank information of the fail address stored in the row/column address register selected by the selection signals SEL<0:2> among the 3 row/column address registers.

The fail row addresses RA<1:14> are the fail row address information stored in the row/column address register selected by the selection signals SEL<0:2> among the 3 row/column address registers. The fail column addresses CA<3:9> are the fail column address information stored in the row/column address register selected by the selection signals SEL<0:2> among the 3 row/column address registers.

The fuse set signals FS<0:K> represent the information of the row fuse set or the information of the column fuse set selected by the repair mode selection signal XY_SEL in a row/column fuse set register (described later). The repair mode selection signal XY_SEL is a signal which is generated in a fail mode analysis circuit (described later) and is used to select a row fuse set or a column fuse set in the row/column fuse set register. For example, a row fuse set may be selected when the repair mode selection signal XY_SEL is the low level. Further, a column fuse set may be selected when the repair mode selection signal XY_SEL is the high level.

The oscillation circuit 600 generates the clock signal CLK according to a boot-up enable signal BOOTUP_EN and a rupture enable signal RUPTURE_EN. The oscillation circuit 600 also outputs the clock signal CLK to the self-repair control circuit 100, the rupture control circuit 400, and the fuse array 500.

The boot-up enable signal BOOTUP_EN is a signal which is used when booting up the fuse array 500. The rupture enable signal RUPTURE_EN is a signal which is used when performing a repair operation. The clock signal CLK is a signal for driving the counter of the self-repair control circuit 100 by the output of an oscillator upon boot-up of the fuse array 500.

The data control circuit 300 controls data by receiving the bank signals BK<0:2>, the fail row addresses RA<1:14>, the fail column addresses CA<3:9>, the fuse set signals FS<0:K>, a column region identification signal OCT, mat selection signals SMAT<0:5>, the repair mode selection signal XY_SEL, a fail mode signal XY_SELFIX, memory repair data MRD<0:M> and a self-rupture signal SELFRUP.

The memory repair data MRD<0:M> are externally input signals which include fail information such as the information of a bank, a row address, a column address and a fuse set. The self-rupture signal SELFRUP is a signal which is used when enabling a self-repair mode.

The data control circuit 300 outputs the bank addresses BANK<0:2>, addresses ADD<0:N> and fuse signals FUSE_SET<0:K> to the fuse array 500. The addresses ADD<0:N> are addresses which include a fuse group position and address bits to cut.

The rupture control circuit 400 outputs rupture control signals RUP_CTRL<0:S> for controlling the rupture operation of the fuse array 500 in correspondence to a fuse nonuse signal OVERFLOW, the clock signal CLK and the rupture enable signal RUPTURE_EN.

The fuse nonuse signal OVERFLOW as a combined signal of a row fuse nonuse signal RF_OVERFLOW (described later) and a column fuse nonuse signal CF_OVERFLOW (described later) is a signal which represents whether or not there is an unused fuse set. For example, if both the row fuse nonuse signal RF_OVERFLOW and the column fuse nonuse signal CF_OVERFLOW are low levels, the fuse nonuse signal OVERFLOW becomes a low level. Conversely, if even any one of the row fuse nonuse signal RF_OVERFLOW and the column fuse nonuse signal CF_OVERFLOW is a high level, the fuse nonuse signal OVERFLOW becomes a high level. The rupture control signals RUP_CTRL<0:S> are signals which control the rupture operation of the fuse array 500 when performing repair.

The fuse array 500 performs the rupture operation for a fuse in correspondence to the bank addresses BANK<0:2>, the addresses ADD<0:N>, the fuse signals FUSE_SET<0:K>, the clock signal CLK, and the rupture control signals RUP_CTRL<0:S>. The fuse array 500 also outputs the row fuse set signals (RF_EN, RF_DIS) and the column fuse set signals (CF_EN, CF_DIS).

The row fuse set signal RF_EN is an enable signal for a row fuse set selected upon scanning of the fuse array 500 in a boot-up process. The row fuse set signal RF_EN is a signal which represents whether a row fuse set is used or not. For example, whether a row redundancy is used or not may be represented in an enable fuse through cut/no cut of the fuse. The row fuse set signal RF_DIS is a disable signal for a row fuse set selected upon scanning of the fuse array 500 in the boot-up process. The row fuse set signal RF_DIS is a signal which represents whether a row fuse set is failed or not. For example, whether a row redundancy is failed or not may be represented in a disable fuse through cut/no cut of the fuse.

The column fuse set signal CF_EN is an enable signal for a column fuse set selected upon scanning of the fuse array 500 in the boot-up process. For example, the column fuse set signal CF_EN is a signal which represents whether a column fuse set is used or not. For example, whether a column redundancy is used or not may be represented in an enable fuse through cut/no cut of the fuse. The column fuse set signal CF_DIS is a disable signal for a column fuse set selected upon scanning of the fuse array 500 in the boot-up process. For example, the column fuse set signal CF_DIS is a signal which represents whether a column fuse set is failed or not. For example, whether a column redundancy is failed or not may be represented in a disable fuse through cut/no cut of the fuse.

As the size of each of elements which construct a semiconductor integrated circuit device becomes smaller and the number of elements included in one semiconductor chip becomes huge, the level of fail density increases. Such increase in fail density serves as a factor that directly decreases the yield of a semiconductor device. In the case where fail density increases severely, a wafer on which semiconductor devices are formed should be discarded.

In order to decrease such fail density, a redundancy circuit for replacing a failed cell with a redundancy cell has been suggested in the art. In the case of a semiconductor memory device, a redundancy circuit (or a fuse circuit) may be disposed for each of a row-related line (for example, a word line) and a column-related line (for example, a bit line).

The redundancy circuit includes the fuse array 500 which stores the address information of a failed cell. The fuse array 500 is constructed by a plurality of fuse sets each including a plurality of fuse lines. The fuse array 500 is a memory which stores information on the respective bits of all fail addresses. The fuse array 500 selects a corresponding row line according to an address as fuse selection information.

In each fuse set, information is programmed in such a way as to fuse a fuse by overcurrent. Self-repair is performed for the purpose of repairing a bit fail in the packaged state of a memory.

Upon completion of the memory test, the fuse array 500 may receive fail information of a corresponding memory cell, and may permanently stores fail information by rupturing electrical fuses corresponding to respective bits. The fuse array 500 performs the rupture operation in correspondence to the rupture control signals RUP_CTRL<0:S> applied from the rupture control circuit 400.

The fuse array 500 stores the address information of a failed cell according to the rupture operation when the rupture control signals RUP_CTRL<0:S> are enabled. Conversely, the fuse array 500 does not perform the rupture operation when the rupture control signals RUP_CTRL<0:S> are disabled. Each fuse set may be constructed by electrical fuses which program information in such a way as to fuse fuses by overcurrent.

Figure 2:
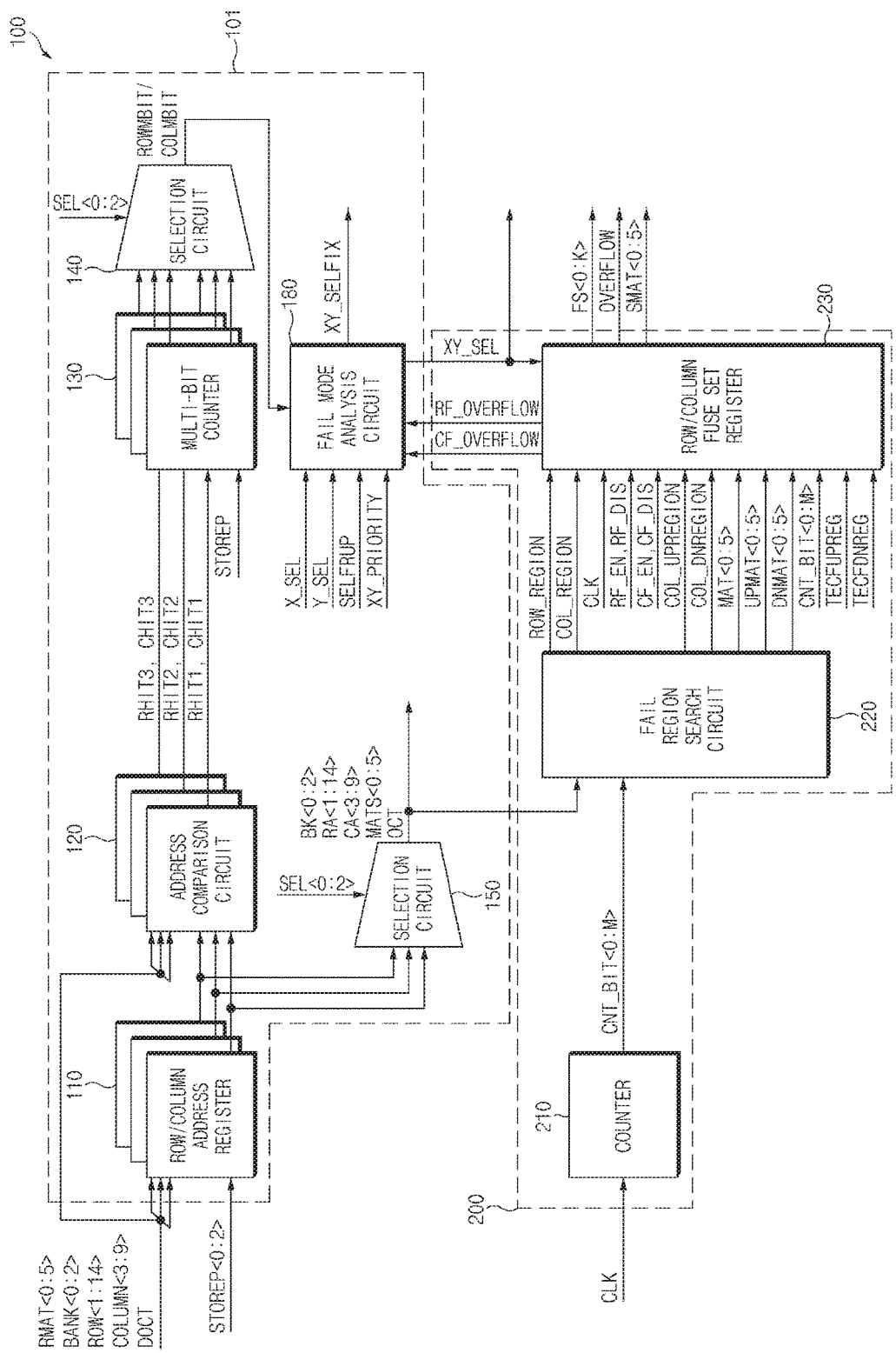
FIG. 2 is a block diagram illustrating a representation of an example of the self-repair control circuit illustrated in FIG. 1.

FIG. 2 is a block diagram illustrating a representation of an example of the self-repair control circuit 100 illustrated in FIG. 1.

Referring to FIG. 2, the self-repair control circuit 100 includes a repair selection circuit 101 and a fuse set selection circuit 200. When a fail occurs, the repair selection circuit 101 stores a row address and a column address corresponding to a fail bit. The repair selection circuit 101 may also analyze a fail mode by comparing a fail address inputted during a memory test mode with the already stored addresses. The fuse set selection circuit 200 outputs fail address information and row fuse set information or column fuse set information in correspondence to a fail mode.

The repair selection circuit 101 includes row/column address registers 110, address comparison circuits 120, multi-bit counters 130, selection circuits (140, 150), and a fail mode analysis circuit 180. The fuse set selection circuit 200 includes a counter 210, a fail region search circuit 220, and a row/column fuse set register 230.

When fails occur during a memory test, the row/column address registers 110 store the row/column addresses of random bits in order in which the fails occur. When fail bits additionally occur, each fail bit is compared with the row addresses or the column addresses of the previously stored fail bits. Further, if the fail bit is the same as even any one of the row addresses and the column addresses, the fail bit is not stored in the row/column address registers 110.

The row/column address registers 110 receive the mat addresses RMAT<0:5>, the bank addresses BANK<0:2>, the row addresses ROW<1:14>, the column addresses COLUMN<3:9>, a fail region identification signal DOCT, and the storage signals STOREP<0:2>.

In this case, the mat addresses RMAT<0:5> may be generated by the row address. The fail region identification signal DOCT may indicate a column region including a fail region from among the group of column region identification signals OCT<0:7> of a memory cell which is divided into 8 parts for the order of 8 bursts of data during the write/read operation of the semiconductor memory device.

For example, if the fail region identification signal DOCT is at a low level, this means that a fail region is located in the region of the column region identification signals OCT<0:3>. In contrast, if the fail region identification signal DOCT is at a high level, this means that the fail region is located in the region of the column region identification signals OCT<4:7>.

The address comparison circuits 120 compare all fail bits which occur during the test, with the row addresses and column addresses of the fail bits already stored in the row/column address registers 110.

The address comparison circuits 120 may compare the mat addresses RMAT<0:5>, the bank addresses BANK<0:2>, the row addresses ROW<1:14>, the column addresses COLUMN<3:9>, and the fail region identification signal DOCT with the output signals of the row/column address registers 110, and may output comparison signals (RHIT3, CHIT3, RHIT2, CHIT2, RHIT1, CHIT1).

In this case, the comparison signals (RHIT1, RHIT2, RHIT3) are signals generated where the fail row addresses currently occurred in the function test are the same as the 3 row addresses already stored in the row/column address registers 110 when they are compared with each other. In other words, the comparison signal RHIT1 represents a result of comparing the row address stored in the first row/column address register 110. The comparison signal RHIT2 represents a result of comparing the row address stored in the second row/column address register 110. The comparison signal RHIT3 represents a result of comparing the row address stored in the third row/column address register 110.

The comparison signals (CHIT1, CHIT2, CHIT3) are signals generated where the fail column addresses currently occurred in the memory test are the same as the 3 column addresses already stored in the row/column address registers 110 when they are compared with each other. In other words, the comparison signal CHIT1 represents a result of comparing the column address stored in the first row/column address register 110. The comparison signal CHIT2 represents a result of comparing the column address stored in the second row/column address register 110. In addition, the comparison signal CHIT3 represents a result of comparing the column address stored in the third row/column address register 110.

The multi-bit counters 130 may increase a corresponding multi-bit count value 1 by 1 whenever row addresses or column addresses are the same, during the comparison process of the address comparison circuits 120. The multi-bit counters 130 may count the comparison signals (RHIT3, CHIT3, RHIT2, CHIT2, RHIT1, CHIT1) in correspondence to a storage signal STOREP. The multi-bit counters 130 may also output counted values to the selection circuit 140. The storage signal STOREP is a pulse signal which is used to increase the values of the 3 multi-bit counters 130 in combination with the comparison signals (RHIT1, RHIT2, RHIT3, CHIT1, CHIT2, CHIT3).

The multi-bit counters 130 may be changed in a count value serving as a reference for determining a row-oriented fail or a column-oriented fail. In other words, if a row fail count reaches a reference value, a row multi-bit signal ROWMBIT becomes high and represents a row-oriented fail. Further, if a column fail count reaches a reference value, a column multi-bit signal COLMBIT becomes high and represents a column-oriented fail.

The selection circuit 140 may output the row multi-bit signal ROWMBIT and the column multi-bit signal COLMBIT by selecting the output signals of the multi-bit counters 130 in correspondence to the selection signals SEL<0:2>.

The row multi-bit signal ROWMBIT is the output of the multi-bit counter 130 optionally selected by the selection signals SEL<0:2> among the 3 multi-bit counters 130. The column multi-bit signal COLMBIT is the output of the multi-bit counter 130 optionally selected by the selection signals SEL<0:2> among the 3 multi-bit counters 130.

The selection circuit 150 outputs the bank signals BK<0:2>, the fail row addresses RA<1:14>, the fail column addresses CA<3:9>, the mat signals MATS<0:5>, and the column region identification signal OCT, by selecting the outputs of the row/column address registers 110 in correspondence to the selection signals SEL<0:2>. For example, the selection circuit 150 selects one row/column address register 110 among the 3 row/column address registers 110 in correspondence to the selection signals SEL<0:2>.

The counter 210 may count the clock signal CLK. The counter 210 outputs count signals CNT_BIT<0:M> to the fail region search circuit 220.

The fail region search circuit 220 searches a row address fail region and a column address fail region in correspondence to the output of the selection circuit 150 when one row/column address register 110 is selected by the selection circuit 150 and the fuse array 500 is booted up.

The fail region search circuit 220 receives the bank signals BK<0:2>, the fail row addresses RA<1:14>, the fail column addresses CA<3:9>, the mat signals MATS<0:5>, the column region identification signal OCT, and the count signals CNT_BIT<0:M>. The fail region search circuit 220 may also output various signals which includes the information of a corresponding region, for example, a row region signal ROW_REGION, a column region signal COL_REGION, an upper region signal COL_UPREGION, a lower region signal COL_DNREGION, mat signals MAT<0:5>, upper mat selection signals UPMAT<0:5>, and lower mat selection signals DNMAT<0:5>.

The row region signal ROW_REGION is generated as the bank signals BK<0:2>, the fail row addresses RA<1:14>, the fail column addresses CA<3:9> and the count signals CNT_BIT<0:M> are combined in the fail region search circuit 220, and also represents the row address region of a failed cell.

The column region signal COL_REGION is generated as the bank signals BK<0:2>, the fail row addresses RA<1:14>, the fail column addresses CA<3:9> and the count signals CNT_BIT<0:M> are combined in the fail region search circuit 220. The column region signal COL_REGION may also represent the column address region of a failed cell.

If the test is ended, one optional row/column address register 110 is selected by the selection signals SEL<0:2> among the row/column address registers 110 in which fail bits are stored. Then, the fail mode analysis circuit 180 analyzes the fail mode of the fail bit stored in the selected row/column address register 110 in correspondence to the output of the selection circuit 140. The fail modes of a fail bit may include a single bit fail, a row-oriented fail, a column-oriented fail, a cluster-oriented fail, and so forth.

The fail mode analysis circuit 180 receives the row multi-bit signal ROWMBIT, the column multi-bit signal COLMBIT, the self rupture signal SELFRUP, the redundancy control signal XY_PRIORITY, the row redundancy selection signal X_SEL, the column redundancy selection signal Y_SEL, the row fuse nonuse signal RF_OVERFLOW, and the column fuse nonuse signal CF_OVERFLOW. The fail mode analysis circuit 180 outputs the repair mode selection signal XY_SEL and the fail mode signal XY_SELFIX to conform to the analyzed fail mode.

The repair mode selection signal XY_SEL is a signal which selects a fuse set and an address to perform repair by selecting one of a row redundancy and a column redundancy. The fail mode signal XY_SELFIX can identify whether the fail mode is a column-oriented fail or another oriented fail.

For example, if the fail mode signal XY_SELFIX is at a low level, this means that the fail mode is any one of the row-oriented fail, the cluster-oriented fail, and the bit-oriented fail. If the fail mode signal XY_SELFIX is at a high level, this means that the fail mode is the column-oriented fail.

In this case, the fail mode signal XY_SELFIX may operate, irrespective of the redundancy control signal XY_PRIORITY, the row fuse nonuse signal RF_OVERFLOW, and the column fuse nonuse signal CF_OVERFLOW. However, the fuse set selection signal SEL_FIX may receive a feedback result of the row fuse nonuse signal RF_OVERFLOW and the column fuse nonuse signal CF_OVERFLOW which represents the presence or absence of a nonuse fuse set according to a phase of the redundancy control signal XY_PRIORITY, and may thus perform phase decision according to the feedback result.

For example, assuming that the redundancy control signal XY_PRIORITY is at a low level and the repair mode selection signal XY_SEL is at a low level, if the row fuse nonuse signal RF_OVERFLOW is at a low level (indicating the absence of a nonuse row fuse set), the repair mode selection signal XY_SEL may transition to a high level.

In contrast, assuming that the redundancy control signal XY_PRIORITY is at a high level and the repair mode selection signal XY_SEL is at a high level, if the column fuse nonuse signal CF_OVERFLOW is at a low level (indicating the absence of a nonuse column fuse set), the repair mode selection signal XY_SEL may transition to a low level.

The row fuse nonuse signal RF_OVERFLOW is a signal which represents whether there is an unused row fuse set in a corresponding row address fail region. For example, if the row fuse nonuse signal RF_OVERFLOW is the high level, it represents that there is an unused row fuse set. Further, if the row fuse nonuse signal RF_OVERFLOW is the low level, it represents that there is no unused row fuse set.

The column fuse nonuse signal CF_OVERFLOW is a signal which represents whether there is an unused column fuse set in a corresponding column address fail region. For example, if the column fuse nonuse signal CF_OVERFLOW is the high level, it represents that there is an unused column fuse set. Moreover, if the column fuse nonuse signal CF_OVERFLOW is the low level, it represents that there is no unused column fuse set.

The fail mode analysis circuit 180 analyzes a fail mode according to the logic levels of the row multi-bit signal ROWMBIT and the column multi-bit signal COLMBIT. For example, if both the row multi-bit signal ROWMBIT and the column multi-bit signal COLMBIT are low, analysis is made to a bit fail. If the row multi-bit signal ROWMBIT is low and the column multi-bit signal COLMBIT is high, analysis is made to a column-oriented fail. If the row multi-bit signal ROWMBIT is high and the column multi-bit signal COLMBIT is low, analysis is made to a row-oriented fail. If both the row multi-bit signal ROWMBIT and the column multi-bit signal COLMBIT are high, analysis is made to a cluster-oriented fail or a row- or column-oriented fail.

The row/column fuse set register 230 searches, stores and outputs information on an unused row redundancy fuse set and an unused column redundancy fuse set. In addition, the row/column fuse set register 230 outputs information on whether there is an unused fuse set.

The row/column fuse set register 230 may receive the row region signal ROW_REGION, the column region signal COL_REGION, the clock signal CLK, the row fuse set signals (RF_EN, RF_DIS), the column fuse set signals (CF_EN, CF_DIS), the repair mode selection signal XY_SEL, the upper region signal COL_UPREGION, the lower region signal COL_DNREGION, the mat signals MAT<0:5>, the upper mat selection signals UPMAT<0:5>, the lower mat selection signals DNMAT<0:5>, the count signals CNT_BIT<0:M>, the upper selection signal TECFUPREG, and the lower selection signal TECFDNRE. In addition, the row/column fuse set register 230 may output the row fuse nonuse signal RF_OVERFLOW, the column fuse nonuse signal CF_OVERFLOW, the fuse set signal FS<0:K>, the fuse nonuse signal OVERFLOW, and the mat selection signal SMAT<0:5>.

Figure 3:
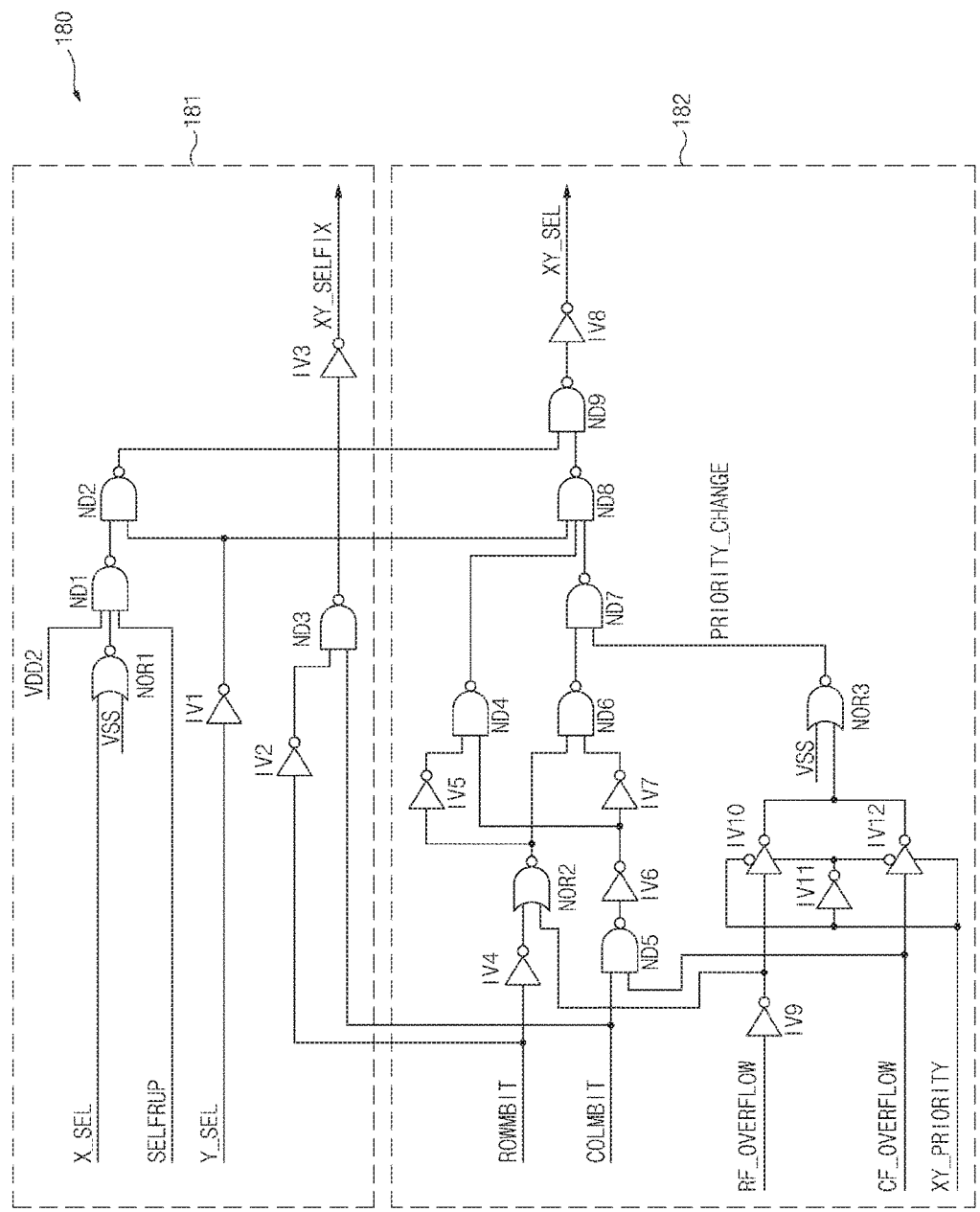
FIG. 3 is a circuit diagram illustrating a representation of an example of the fail mode analysis circuit illustrated in FIG. 2.

FIG. 3 is a circuit diagram illustrating a representation of an example of the fail mode analysis circuit 180 illustrated in FIG. 2.

Referring to FIG. 3, the fail mode analysis circuit 180 includes a selection signal generation circuit 181 and a control signal generation circuit 182.

The selection signal generation circuit 181 may include a plurality of NAND gates ND1~ND3, a plurality of inverters IV1~IV3, and a NOR gate NOR1. The NOR gate NOR1 may perform a NOR logic operation between the row redundancy selection signal X_SEL and the ground voltage VSS. The NAND gate ND1 may perform a NAND logic operation among the power-supply voltage VDD2, the output signal of the NOR gate NOR1, and the self rupture signal SELFRUP.

The NAND gate ND2 may perform a NAND logic operation between the column redundancy selection signal Y_SEL inverted by the inverter IV1 and the output signal of the NAND gate ND1. The NAND gate ND3 may perform a NAND logic operation between the row multi-bit signal ROWMBIT inverted by the inverter IV2 and the column multi-bit signal COLMBIT. The inverter IV3 may output the fail mode signal XY_SELFIX by inverting the output signal of the NAND gate ND3.

The control signal generation circuit 182 includes a plurality of NAND gates (ND4~ND9), a plurality of inverters (IV4~IV12), and a plurality of NOR gates (NOR2, NOR3).

The NOR gate NOR2 may perform a NOR logic operation between the row multi-bit signal ROWMBIT inverted by the inverter IV4 and the row fuse nonuse signal RF_OVERFLOW inverted by the inverter IV9. The NAND gate ND4 may perform a NAND logic operation between the output signal of the inverter IV5 and the output signal of the inverter IV6. The NAND gate ND5 may perform a NAND logic operation between the column multi-bit signal COLMBIT and the column fuse nonuse signal CF_OVERFLOW.

The inverters (IV6, IV7) may perform non-inversion delaying of the output signal of the NAND gate ND5. The NAND gate ND6 may perform a NAND logic operation between the output signal of the NOR gate NOR2 and the output signal of the inverter IV7. The NAND gate ND7 may perform a NAND logic operation between the output signal of the NAND gate ND6 and the priority signal PRIORITY_CHANGE. The NAND gate ND8 may perform a NAND logic operation between the output signal of the inverter IV1 and the output signals of the NAND gates (ND4, ND7). The NAND gate ND9 may perform a NAND logic operation between the output signal of the NAND gate ND2 and the output signal of the NAND gate ND8. The inverter IV8 may perform the output signal of the NAND gate ND9, and may output the repair mode selection signal XY_SEL by inverting the output signal of the NAND gate ND9.

Inverters (IV9, IV10) may perform non-inversion delaying of the row fuse nonuse signal RF_OVERFLOW, and output the non-inversion delayed signal to the NOR gate NOR3. The inverter IV11 may invert the redundancy control signal XY_PRIORITY. The inverter IV12 may invert the column fuse nonuse signal CF_OVERFLOW, and output the non-inversion delayed signal to the NOR gate NOR3. The NOR gate NOR3 may perform a NOR logic operation between the ground voltage VSS and the output signals of the inverters (IV10, IV11), and then output the priority signal PRIORITY_CHANGE.

If the repair mode selection signal XY_SEL is at a low level, the row fuse set is selected. If the repair selection signal XY_SEL is at a high level, the column fuse set is selected.

Table 1 is a table for the fail mode analysis circuit 180 to define fail modes in correspondence to the logic levels of the priority signal PRIORITY_CHANGE, the row multi-bit signal ROWMBIT, the column multi-bit signal COLMBIT, and the repair mode selection signal XY_SEL.

TABLE 1

| PRIORITY_CHANGE | ROWMBIT | COLMBIT | XY_SEL | Fail mode |
| --- | --- | --- | --- | --- |
| 0 | 0 | 0 | 0 | Row (bit) |
| 0 | 0 | 1 | 1 | Column-oriented |
| 0 | 1 | 0 | 0 | Row-oriented |
| 0 | 1 | 1 | 0 | Row (cluster) |
| 1 | 0 | 0 | 1 | Column (bit) |
| 1 | 0 | 1 | 1 | Column-oriented |
| 1 | 1 | 0 | 0 | Row-oriented |
| 1 | 1 | 1 | 1 | Column (cluster) |

As illustrated in Table 1, the fail mode analysis circuit 180 controls the logic level of the repair mode selection signal XY_SEL according to a fail mode by combining the logic levels of the priority signal PRIORITY_CHANGE, the row multi-bit signal ROWMBIT, and the column multi-bit signal COLMBIT.

Figure 4:
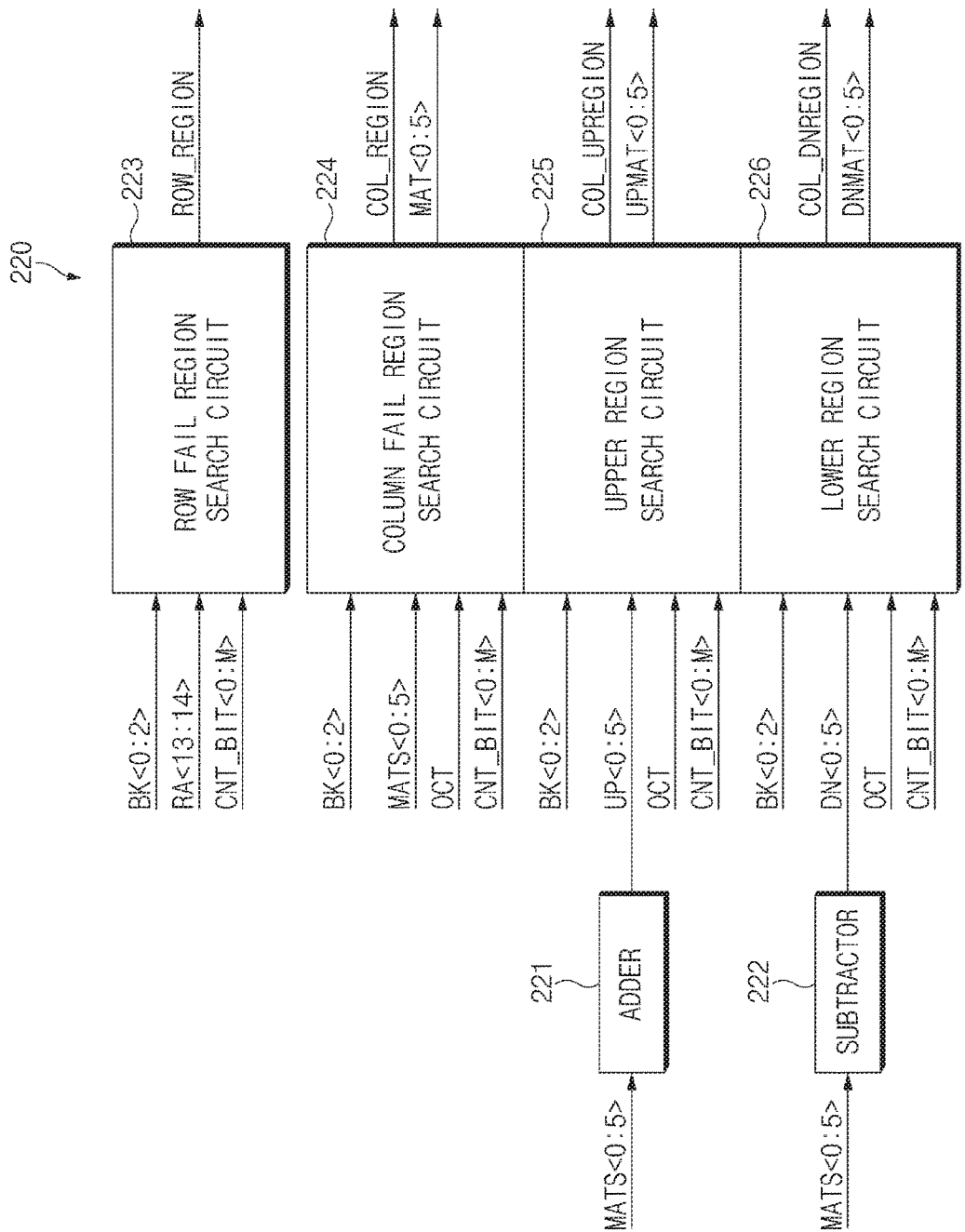
FIG. 4 is a block diagram illustrating the fail region search circuit illustrated in FIG. 2.

FIG. 4 is a block diagram illustrating the fail region search circuit 220 illustrated in FIG. 2.

Referring to FIG. 4, the fail region search circuit 220 may include an adder 221, a subtractor 222, a row fail region search circuit 223, a column fail region search circuit 224, an upper region search circuit 225, and a lower region search circuit 226.

The adder 221 may increase the mat signals MATS<0:5> indicating the fail mat addresses one by one, and thus output the upper selection signals UP<0:5>. In this case, the adder 221 may include an "+1 adder" which increases the input signal by "+1" and outputs the increased signal.

The subtractor 222 may reduce the mat selection signals MAT<0:5> indicating the fail mat addresses one by one, and thus output the lower selection signals DN<0:5>. In this case, the subtractor 222 may include an "−1 adder" which reduces the input signal by "−1" and outputs the reduced result.

The row fail region search circuit 223 may receive the bank signals BK<0:2> corresponding to the bank addresses BANK<0:2>, the row addresses RA<13:14>, and the count signals CNT_BIT<0:M>, and thus output the row region signal ROW_REGION. In this case, the row addresses RA<13:14> may be addresses to access the row repair region.

The row fail region search circuit 223 may receive the row addresses RA<13:14> selected from among 3 row addresses stored in the row/column address registers 110. The row fail region search circuit 223 may compare the count signals CNT_BIT<0:M> corresponding to the output of the boot-up counter 210 with the row addresses RA<13:14>, when the fuse array 500 is booted up. Accordingly, the row fail region search circuit 223 may search for position information of the row repair region in which a fail occurs, and may enable the row region signal ROW_REGION.

The column fail region search circuit 224 may receive the bank signals BK<0:2>, the mat signals MATS<0:5>, the column region identification signal OCT, and the count signal CNT_BIT<0:M>, and may output the column region signal COL_REGION and the mat signals MAT<0:5>. In this case, the mat signals MAT<0:5> may be addresses of the failed mats. One mat from among the plurality of mats each including a plurality of word lines may be accessed by the mat signals MAT<0:5>.

The column fail region search circuit 224 may receive information (i.e., bank signals BK<0:2>, mat signals MATS<0:5>, and the column region identification signal OCT) of one column address selected from among 3 column addresses stored in the row/column address registers 110. The column fail region search circuit 224 may compare the count signals CNT_BIT<0:M> indicating the output of the boot-up counter 210 with the column address information when the fuse array 500 is booted up. Therefore, the column fail region search circuit 224 may search for position information of the column repair region in which a fail occurs, and may enable the column region signal COL_REGION.

The upper region search circuit 225 may receive column address information (e.g., the bank signals BK<0:2>, the upper selection signals UP<0:5>, the column region identification signal OCT, etc.) and the count signals CNT_BIT<0:M>, and output the upper region signal COL_U-

PREGION and the upper mat selection signals UPMAT<0:5>. In this case, the upper mat selection signals UPMAT<0:5> may be mat addresses for accessing the mat sharing a bit line sense amplifier (BLSA) in an upward direction on the basis of the mat signals MAT<0:5>.

The upper region search circuit 225 may receive not only target mat information selected by the mat signals MAT<0:5> of the column fail region search circuit 224, but also the upper mat information which shares the bit line sense amplifier (BLSA) along an upper direction of the target mat.

The upper region search circuit 225 may compare the count signals CNT_BIT<0:M> indicating the output signal of the boot-up counter 210 with the received column address information when the fuse array 500 is booted up. Therefore, the upper region search circuit 225 may search for position information of the column repair region in the upper mat, and may enable the upper region signal COL_UPREGION.

The lower region search circuit 226 may receive not only column address information (e.g., the bank signals BK<0:2>, the lower selection signals DN<0:5>, the column region identification signal OCT, etc.), but also the count signals CNT_BIT<0:M>, and may output the lower region signal COL_DNREGION and the lower mat selection signals DNMAT<0:5>. In this case, the lower mat selection signals DNMAT<0:5> may be mat addresses for accessing the mat which shares the bit line sense amplifier (BLSA) in the lower direction on the basis of the mat signals MAT<0:5>.

The lower region search circuit 226 may receive not only target mat information selected by the mat signals MAT<0:5> of the column fail region search circuit 224, but also the lower mat information sharing the bit line sense amplifier (BLSA) in the lower direction on the basis of the target mat.

The lower region search circuit 226 may compare the count signals CNT_BIT<0:M> indicating the output of the boot-up counter 210 with the received column address information when the fuse array 500 is booted up. Accordingly, the lower region search circuit 226 may search for position information of the column repair region in the lower mat, and may enable the lower region signal COL_DNREGION.

Figure 5:
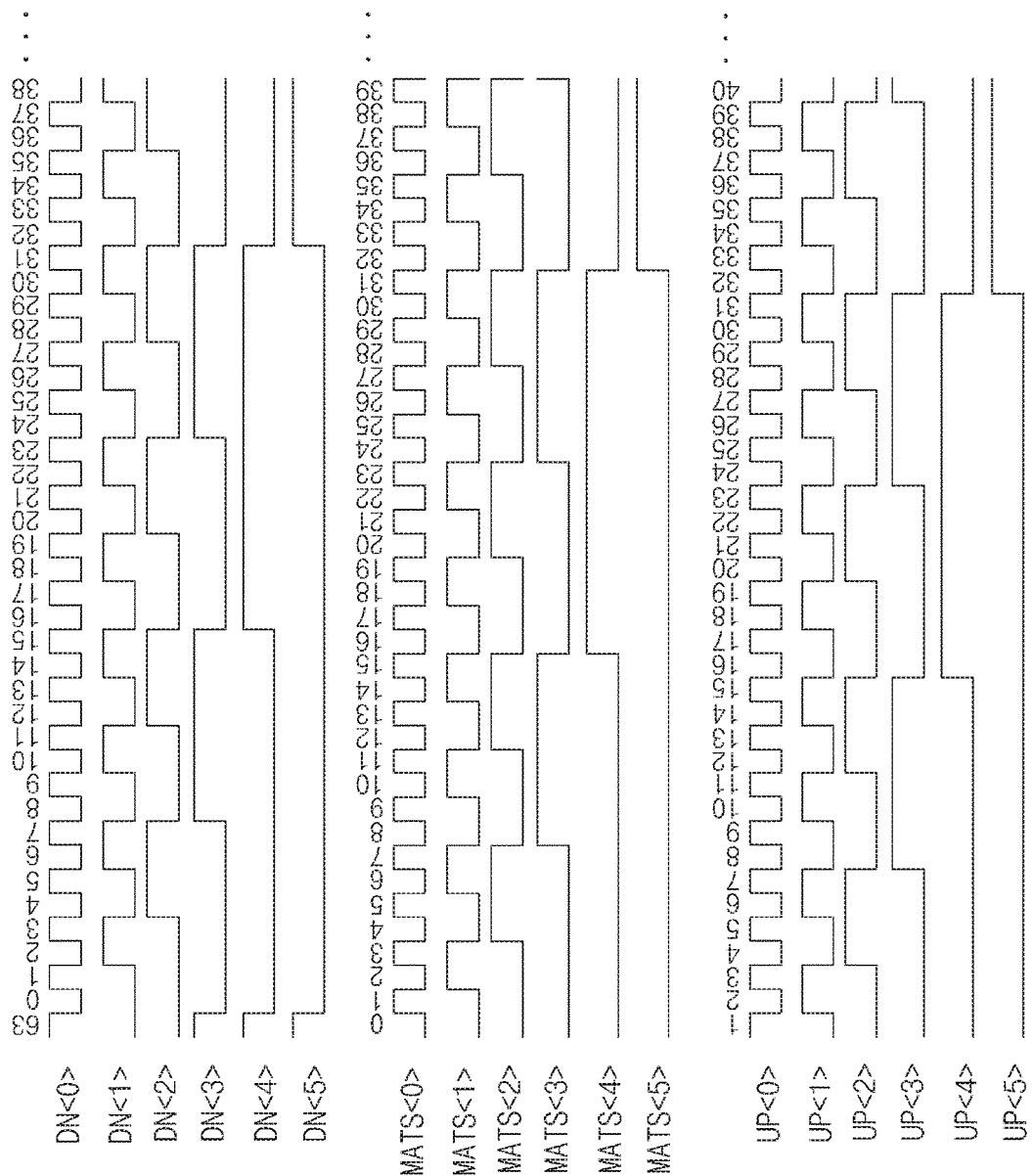
FIG. 5 is a timing diagram illustrating operations of an adder and a subtractor illustrated in FIG. 4.

FIG. 5 is a timing diagram illustrating operations of the adder 221 and the subtractor 222 illustrated in FIG. 4.

Referring to FIGS. 2 and 5, the adder 221 and the subtractor 222 may receive the mat signals MATS<0:5> from the selection circuit 150. The adder 221 may increase the code signal matched with the mat information whenever the code value is increased, and may perform the counting operation. The subtractor 222 may reduce the code signal matched with the mat information whenever the code value is reduced, and may perform the counting operation.

For example, it is assumed that the mat signals MATS<0:5> are input until reaching the code values 0~63. Therefore, the adder 221 may increase the mat signals MATS<0:5> one by one, and may output the upper selection signals UP<0:5>. In contrast, the subtractor 222 may reduce the mat selection signals MAT<0:5> one by one, and may output the lower selection signals DN<0:5>. In this case, the subtractor 222 may include the "−1 adder" which reduces the input signal by "−1" and outputs the reduced result.

For example, if the mat signals MATS<0:5> are set to zero "0", the adder 221 may add the corresponding value by "+1" and thus output the resultant value of 1. If the mat signals MATS<0:5> are set to zero "0", the subtractor 222 may reduce the corresponding value by "−1", and thus output the resultant value of 63.

Therefore, it is assumed that the mat signals MATS<0:5> are inputted as the value of zero "0". Therefore, the target mat value is set to zero "0", the upper mat matched with the value of 1, located adjacent to the target mat, is selected as the upper mat, and the lower mat matched with the value of 63, located adjacent to the target mat, is selected as the lower mat.

The embodiment of the present disclosure discloses, for example, that the code values of the mat signals MATS<0:5> applied to the adder 221 and the subtractor 222 are set to 0~63, such that a total of 64 code values are used. However, the number of mat selection signals according to the embodiments is not limited thereto, and may be changed to another without departing from the scope or spirit of the present disclosure.

Figure 6:
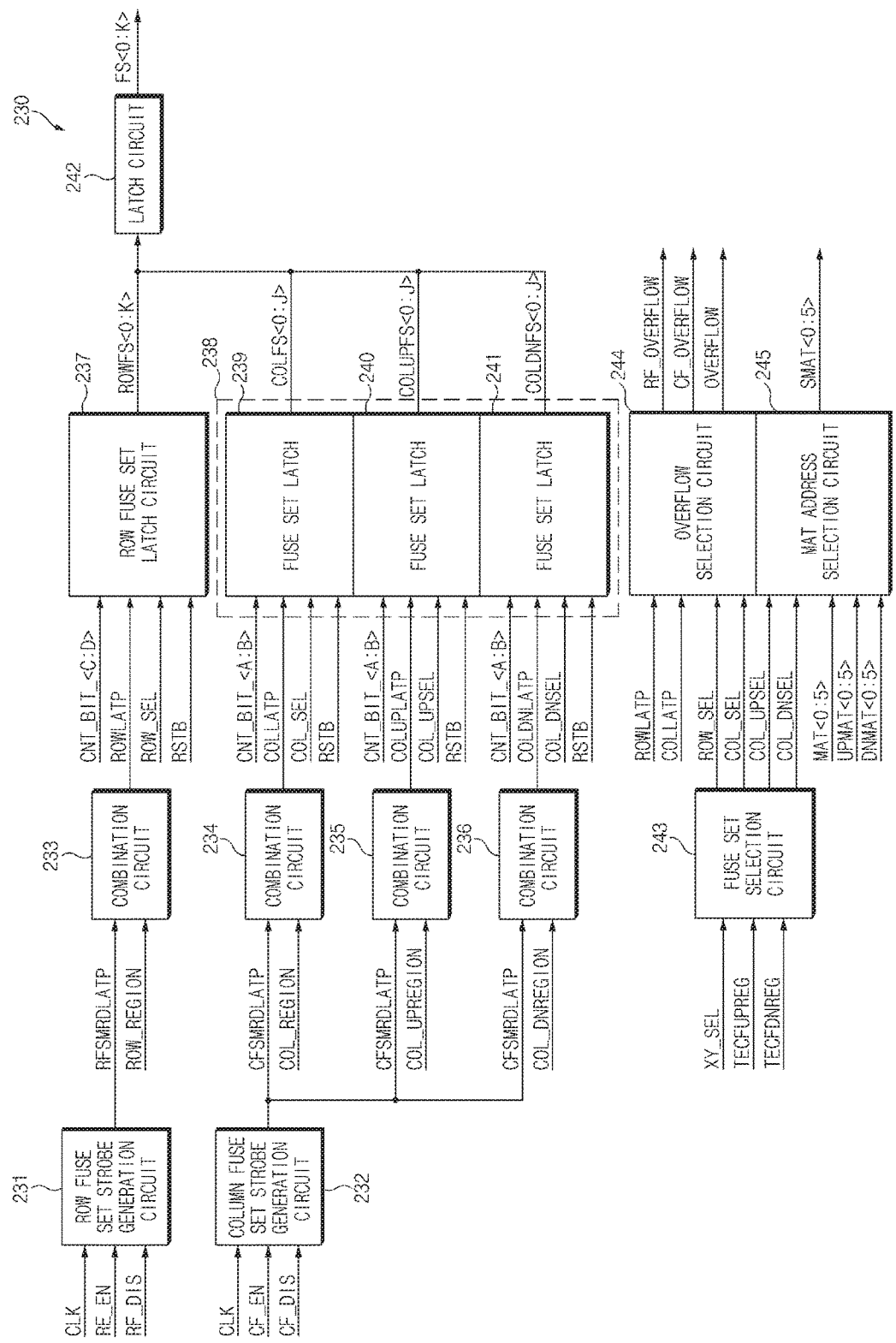
FIG. 6 is a block diagram illustrating the row/column fuse set register illustrated in FIG. 2.

FIG. 6 is a block diagram illustrating the row/column fuse set register 230 illustrated in FIG. 2.

Referring to FIG. 6, the row/column fuse set register 230 may include a row fuse set strobe generation circuit 231, a column fuse set strobe generation circuit 232, a plurality of combination circuits (233~236), a row fuse set latch circuit 237, a column fuse set latch circuit 238, a latch circuit 242, a fuse set selection circuit 243, an overflow selection circuit 244, and a mat address selection circuit 245.

In this case, the row fuse set strobe generation circuit 231 may receive the clock signal CLK and the row fuse set signals (RF_EN, RF_DIS), and may output the row fuse set latch signal RFSMRDLATP to store fuse information in the row fuse set. The column fuse set strobe generation circuit 232 may receive the clock signal CLK and the column fuse set signals (CF_EN, CF_DIS), and may output the column fuse set latch signal CFSMRDLATP to store fuse information in the column fuse set.

In this case, the clock signal CLK may be input when the boot-up operation starts. The row fuse set signals (RF_EN, RF_DIS) and the column fuse set signals (CF_EN, CF_DIS) may indicate fuse set information having been used or failed.

The combination circuit 233 may combine the row fuse set latch signal RFSMRDLATP and the row region signal ROW_REGION, and thus output the row latch signal ROWLATP. In this case, the row region signal ROW_REGION may be used to enable the row repair region at which the row address of the failed cell is located.

The combination circuit 234 may combine the column fuse set latch signal CFSMRDLATP and the column region signal COL_REGION, and thus output the column latch signal COLLATP. In this case, the column region signal COL_REGION may enable the column repair region at which the column address of the failed cell is located.

The combination circuit 235 may combine the column fuse set latch signal CFSMRDLATP and the upper region signal COL_UPREGION, and thus output the upper latch signal COLUPLATP. In this case, in the upper mat which shares, along with the mat including the failed cell, the bit line sense amplifier (BLSA) in the upper direction, the upper region signal COL_UPREGION may enable the column repair region at which the column address is located.

The combination circuit 236 may combine the column fuse set latch signal CFSMRDLATP and the lower region signal COL_DNREGION, and thus output the lower latch signal COLDNLATP. In this case, in the lower mat which shares, along with the mat including the failed cell, the bit line sense amplifier (BLSA) in the lower direction, the lower region signal COL_DNREGION may enable the column repair region at which the column address is located.

In this case, each of the combination circuits 233~236 may include an AND logic circuit configured to perform an AND logic operation of the input signals. The row region signal ROW_REGION, the column region signal COL_RE- GION, the upper latch signal COLUPLATP, and the lower latch signal COLDNLATP may indicate information regarding the repair region at which the failed cell is located.

The row fuse set latch circuit 237 may receive the row latch signal ROWLATP, the count signals CNT_BIT<C:D>, the row selection signal ROW_SEL, and the reset signal RSTB, and thus output the row fuse set signals ROWFS<0:K>. The row fuse set latch signal 237 may store nonuse fuse set information of the row.

The column fuse set latch circuit 238 may include a plurality of fuse set latch circuits 239~241. The column fuse set latch circuit 238 may store nonuse fuse set information of the column.

In this case, the fuse set latch circuit 239 may receive the count signals CNT_BIT<A:B>, the column latch signal COLLATP, the column selection signal COL_SEL, and the reset signal RSTB, and thus output the column fuse set signals COLFS<0:J>. The fuse set latch circuit 240 may receive the count signals CNT_BIT<A:B>, the upper latch signal COLUPLATP, the upper selection signal COL_UPSEL, and the reset signal RSTB, and thus output the upper fuse set signals COLUPFS<0:J>. The fuse set latch circuit 241 may receive the count signals CNT_BIT<A:B>, the lower latch signal COLDNLATP, the lower selection signal COL_DNSEL, and the reset signal RSTB, and thus output the lower fuse set signals COLDNFS<0:J>.

The row fuse set latch circuit 237 and the column fuse set latch circuit 238 may combine input signals, and thus store the nonuse fuse set addresses of the row and column contained in the repair region.

The latch circuit 242 may latch the row fuse set signals ROWFS<0:K>, the column fuse set signals COLFS<0:J>, the upper fuse set signals COLUPFS<0:J>, and the lower fuse set signals COLDNFS<0:J>, and thus output the fuse set signals FS<0:k>. The latch circuit 242 may output the row fuse set information stored in the row fuse set latch circuit 237 or the column fuse set information stored in the column fuse set latch circuit 238 through the fuse set signals FS<0:K>.

The fuse set selection circuit 243 may receive the repair mode selection signal XY_SEL, the upper selection signal TECFUPREG, and the lower selection signal TECFDNREG, and thus output the row selection signal ROW_SEL, the column selection signal COL_SEL, the upper selection signal COL_UPSEL, and the lower selection signal COL_DNSEL.

In this case, the upper selection signal TECFUPREG may select fuse set information of the upper mat which shares, along with the mat including the failed cell, the bit line sense amplifier (BLSA) in the upper direction, during the repair operation. The lower selection signal TECFDNREG may select fuse set information of the lower mat which shares, along with the mat including the failed cell, the bit line sense amplifier (BLSA) in the lower direction, during the repair operation.

The fuse set selection circuit 243 may combine the repair mode selection signal XY_SEL, the upper selection signal TECFUPREG, and the lower selection signal TECFDNREG, and thus output any one of the four fuse set latch groups (237, 239, 240, 241).

The overflow selection circuit 244 may receive the row latch signal ROWLATP, the column latch signal COLLATP, the row selection signal ROW_SEL, and the column selection signal COL_SEL, and may output the row fuse nonuse signal RF_OVERFLOW, the column fuse nonuse signal CF_OVERFLOW, and the nonuse fuse signal OVERFLOW, which indicate the presence or absence of the row fuse set or the column fuse set.

For example, the overflow selection circuit 244 may output the row fuse nonuse signal RF_OVERFLOW and the column fuse nonuse signal CF_OVERFLOW when the nonuse fuse signal OVERFLOW is activated. The row fuse nonuse signal RF_OVERFLOW and the column fuse nonuse signal CF_OVERFLOW may be simultaneously output, irrespective of the row selection signal ROW_SEL and the column selection signal COL_SEL.

If the row selection signal ROW_SEL is enabled, the row fuse nonuse signal RF_OVERFLOW may be output as the nonuse fuse signal OVERFLOW. If the column selection signal COL_SEL is enabled, the column fuse nonuse signal CF_OVERFLOW may be output as the nonuse fuse signal OVERFLOW.

The mat address selection circuit 245 may receive the upper selection signal COL_UPSEL, the lower selection signal COL_DNSEL, the mat signals MAT<0:5>, the upper mat selection signals UPMAT<0:5>, and the lower mat selection signals DNMAT<0:5>, and thus output the mat selection signals SMAT<0:5>. In this case, the mat selection signals SMAT<0:5> may be mat addresses for selecting the mat signals MAT<0:5>, the upper mat selection signals UPMAT<0:5>, or the lower mat selection signals DNMAT<0:5> by combining the upper selection signal COL_UPSEL and the lower selection signal COL_DNSEL.

During the repair operation, the mat address selection circuit 245 may select any one group from among the mat signals MAT<0:5>, the upper mat selection signals UPMAT<0:5>, and the lower mat selection signals DNMAT<0:5> according to the upper selection signal COL_UPSEL and the lower selection signal COL_DNSEL, and thus output the selected group to the mat selection signals SMAT<0:5>.

For example, if the upper selection signal COL_UPSEL and the lower selection signal COL_DNSEL are low, the mat signals MAT<0:5> may be output as the mat selection signals SMAT<0:5>. If the upper selection signal COL_UPSEL is at a high level and the lower selection signal COL_DNSEL is at a low level, the upper mat selection signals UPMAT<0:5> may be output as the mat selection signals SMAT<0:5>. If the upper selection signal COL_UPSEL is at a low level and the lower selection signal COL_DNSEL is at a high level, the lower mat selection signals DNMAT<0:5> may be output as the mat selection signals SMAT<0:5>.

When a fail bit occurs in the memory test, a process for capturing the fail bit, a process for analyzing a fail mode, and a process for selecting a fuse set appropriate for the fail mode according to an embodiment of the present disclosure will hereinafter be described below. Although several fail bits can be captured and repaired, an embodiment will disclose, for example, the method for capturing 3 bits and the method for repairing 3 mats.

Figure 7:
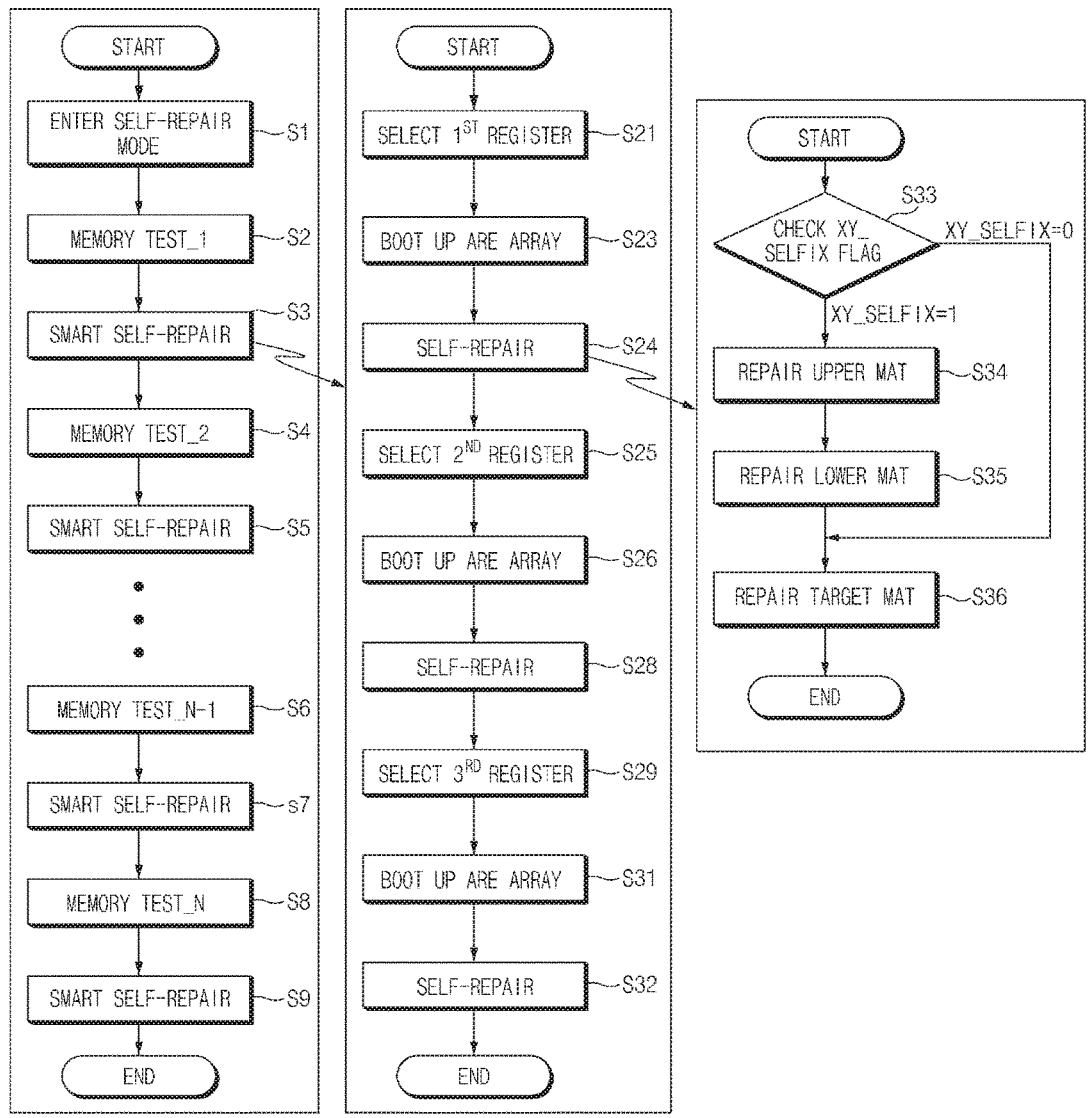
FIG. 7 is a flowchart to assist in the explanation of operations of the smart self-repair device according to an embodiment of the present disclosure.

FIG. 7 is a flowchart to assist in the explanation of operations of the smart self-repair device according to an embodiment of the present disclosure.

Referring to FIG. 7, after entering a self-repair mode to capture a fail bit (step S1), a first function test (Function_1) is performed (step S2). If a fail occurs, the fail is stored in the row/column address registers 110. In this case, the address comparison circuits 120 and the multi-bit counters 130 are operated whenever the additional fail occurs, information for fail mode identification is collected (step S2).

Upon completion of the memory test, the smart self-repair operation is carried out (step S3).

The self-repair operation in step S3 will hereinafter be described below. If a first fail is selected, the first row/column address register 110 is selected (step S21), fail information is transmitted to the fail mode analysis circuit 180 and the fail region search circuit 220. In addition, after the fuse array 500 is booted up and the fuse set is selected in the corresponding fail region, the selected fuse set is stored in the row/column fuse set register 230, and the fail mode analysis circuit 180 determines the repair mode (row or column) (step S23). Thereafter, the corresponding fuses are selected one by one in the fuse array 500 in such a manner that the self-repair operation is performed (step S24).

After that, if a second fail occurs, the second row/column address register 110 is selected (step S25), fail information is transmitted to the fail mode analysis circuit 180 and the fail region search circuit 220. After the fuse array 500 is booted up and the fuse set is selected in the corresponding fail region, the selected fuse set is stored in the row/column fuse set register 230, and the fail mode analysis circuit 180 may determine the repair mode (row or column) (step S26). Thereafter, the corresponding fuses are selected one by one in the fuse array 500 in such a manner that the self-repair operation is performed (step S28).

If a third fail occurs, the third row/column address register 110 is selected (step S29), fail information is transmitted to the fail mode analysis circuit 180 and the fail region search circuit 220. After the fuse array 500 is booted up and the fuse set is selected in the corresponding fail region, the selected fuse set is stored in the row/column fuse set register 230, and the fail mode analysis circuit 180 may determine the repair mode (row or column) (step S31). Thereafter, the corresponding fuses are selected one by one in the fuse array 500 in such a manner that the self-repair operation is performed (step S32).

Subsequently, a second memory test (Function_2) is carried out (step S4), and the smart self-repair operation including the steps S21~S32 is carried out (step S5). Thereafter, the (N−1)-th memory test (Function_N−1) is performed (step S6), and the smart self-repair operation including the steps S21~S32 is performed (step S7). The N-th memory test (Function_N) is performed (step S8), and the smart self-repair operation including the steps S21~S32 is performed (step S9).

The self-repair operation of the step S24 will hereinafter be described below. An embodiment can repair not only the target mat located at the center part, but also the upper mat and the lower mat. That is, the self-repair control circuit 100 may check the fail mode signal XY_SELFIX prior to the repair operation, and thus output the low level or high level signal according to the checked result (step S33).

If the fail mode signal XY_SELFIX is at a high level, 3 mats are sequentially repaired. That is, the upper mat located above the target mat may first be repaired (step S34). Then, the lower mat located below the target mat is repaired (step S35). Thereafter, the target mat can be repaired (step S36). In contrast, if the fail mode signal XY_SELFIX is at a low level, only one target mat is repaired (step S36).

Figure 8:
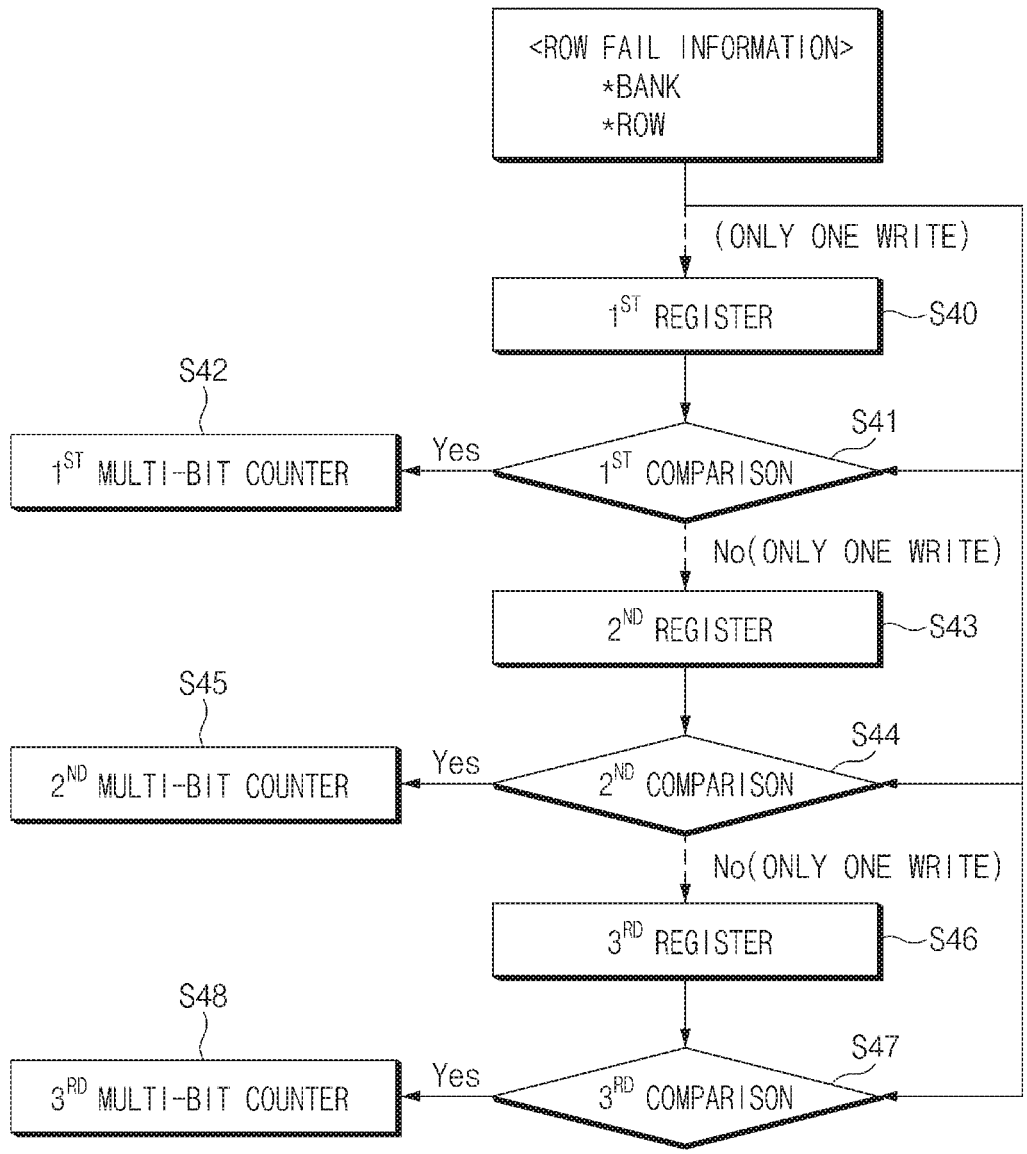
FIGS. 8 and 9 are representations of examples of diagrams to assist in a row/column redundancy fail repair algorithm according to an embodiment of the present disclosure.
Figure 9:
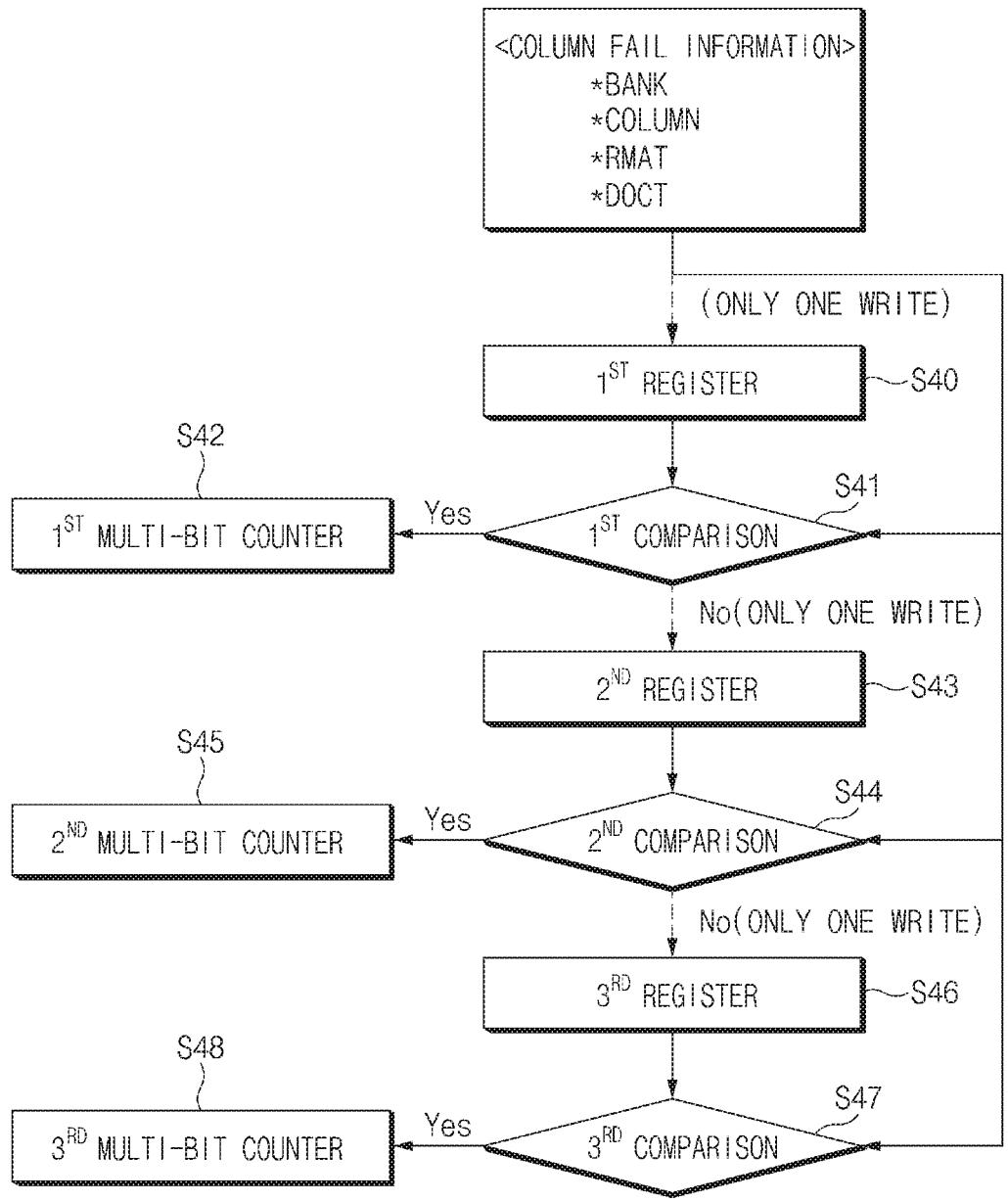

FIGS. 8 and 9 are representations of examples of diagrams to assist in a row/column redundancy fail repair algorithm according to an embodiment of the present disclosure.

FIG. 8 is a flowchart illustrating a method for capturing the bank addresses BANK<0:2> and the row addresses ROW<1:14> indicating row information of the fail bit. FIG. 9 is a flowchart illustrating a method for capturing the bank addresses BANK<0:2>, the column addresses COLUMN<3:9>, the mat addresses RMAT<0:5>, and the fail region identification signal DOCT, which indicate the column information of the fail bit.

If a first fail occurs, row and column information of the fail is stored in the first row/column address register 110 (step S40). In this case, the row/column address register 110 may store only a first fail address therein.

If a second fail occurs, the address of the fail bit is compared with the row/column addresses stored in the first row/column address register 110 (step S41). That is, the address comparison circuits 120 may compare all fail addresses generated in the pattern learning state.

If two addresses have the same row and column information, this means the occurrence of the same bit fail, such that the corresponding addresses are discarded. However, if only one of the row information and the column information is identical in two addresses, the multi-bit counter of the same part from among the row information and the column information in the first row/column multi-bit counter 130 is increased once (step S42). In contrast, if the row/column addresses are different from each other, the fail address is stored in the second row/column address register 110 (step S43). In this case, the row/column address register 110 may store only a second fail address once.

Thereafter, if a third fail occurs, the address of the fail bit is compared with the row/column addresses stored in the first and second row/column address registers 110 (steps S41 and S44). If two addresses to be compared with each other have the same row and column information, this means the occurrence of the same bit fail, such that the corresponding addresses are discarded. However, assuming that only one of the row information and the column information is identical in two addresses, the first or second multi-bit counter 130 is increased once (steps S42 and S45). In contrast, assuming that the fail address is different from the first and second row/column addresses 110, the fail address is stored in the third row/column address register 110 (step S46). In this case, the row/column address register 110 may store only a third fail address only once.

Subsequently, if a fourth fail occurs, the fail bit address is compared with the row/column addresses stored in the first, second, and third row/column address registers 110 (steps S41, S44, and S47). If the same address from among the row and column addresses is preset, the corresponding row/column multi-bit counter 130 is increased (steps S42, S45, and S48). If the row and column addresses to be compared with each other are the same or different from each other, fail information is discarded.

Thereafter, if additional fails (e.g., the fifth fail, the sixth fail, etc.) occur in the subsequent memory test, the operation for comparing the additional fails with the fail information stored in the row/column registers is repeatedly performed until the memory test is ended, such that fail mode information can be collected. The above-mentioned description has disclosed that, when a fail occurs in the memory test, the fail address is captured and compared, and the multi-bit counter is increased.

The method for sequentially selecting the row/column address registers 110, and at the same time analyzing and repairing the fail mode will hereinafter be described below.

If the selection signal SEL<0> is activated, the selection circuit 150 may select the first row/column address register 110, and may output the bank signals BK<0:2>, the fail row addresses RA<1:14>, the fail column addresses CA<3:9>, the mat signals MAT<0:5>, and the column region identification signal OCT to the fail region search circuit 220. The selection circuit 140 may select the first multi-bit counter 130, and thus output the row multi-bit signal ROWMBIT and the column multi-bit signal to the fail mode analysis circuit 180.

As a result, the fail mode analysis circuit 180 may combine the row multi-bit signal ROWMBIT and the column multi-bit signal COLMBIT, and thus output the repair mode selection signal XY_SEL to the row/column fuse set register 230 and the data control circuit 300.

Then, the boot-up enable signal BOOTUP_EN is activated to boot up the fuse array 500. As a result, the oscillation circuit 600 operates to activate the clock signal CLK, and the counter 210 operates to activate the count signals CNT_BIT<0:M>.

After that, the fail region search circuit 220 may combine the count signals CNT_BIT<0:M>, the bank signals BK<0:2>, the fail row addresses RA<1:14>, the fail column addresses CA<3:9>, the mat signals MATS<0:5>, and the column region identification signal OCT, and thus output the row region signal ROW_REGION, the column region signal COL_REGION, the upper region signal COL_UPREGION, and the lower region signal COL_DNREGION, which indicate the fail region section, to the row/column fuse set register 230.

In addition, the fail region search circuit 220 may generate not only the upper mat selection signals UPMAT<0:5> sharing the bit line sense amplifier (BLSA) in the upper direction on the basis of the failed mat signals MAT<0:5>, but also the lower mat selection signals DNMAT<0:5> sharing the BLSA in the lower direction on the basis of the failed mat signals MAT<0:5>, to the row/column fuse set register 230.

The row/column fuse set register 230 may receive the row fuse set signals (RF_EN, RF_DIS) and the column fuse set signals (CF_EN, CF_DIS) from the fuse array 500, and may combine the received row and column fuse set signals with the clock signal CLK, the row region signal ROW_REGION, the column region signal COL_REGION, the upper region signal COL_UPREGION, and the lower region signal COL_DNREGION. The row/column fuse set register 230 may search for an unused row fuse set in the row fail region, may search for an unused column fuse set in the column fail region, and may respectively store the unused row fuse set and the unused column fuse set in the fuse set registers (237, 238).

In addition, the row/column fuse set register 230 may search for an unused column fuse set in the region corresponding to the column fail of the upper mat which shares the bit line sense amplifier (BLSA) along with the column fail mat. The row/column fuse set register 230 may search for an unused column fuse set in the region corresponding to the column fail of the lower mat sharing the BLSA along with the column fail mat, and may store the searched fuse set in each of the corresponding fuse set latch circuits (240, 241).

Thereafter, upon completion of the boot-up operation, the fail mode analysis circuit 180 may select the repair mode (i.e., the row repair mode or the column repair mode) most appropriate for the row/column fuse set register 230 in response to the row fuse nonuse signal RF_OVERFLOW indicating the presence or absence of the unused row fuse set, the column fuse nonuse signal CF_OVERFLOW indicating the presence or absence of the unused column fuse set, the row multi-bit signal ROWMBIT, and the column multi-bit signal COLMBIT.

In this case, the row fuse nonuse signal RF_OVERFLOW is at a high level when the unused row fuse set is present, and is at a low level when the unused row fuse set is not present. In addition, the column fuse nonuse signal CF_OVERFLOW is at a high level when the unused column fuse set is present, and is at a low level when the unused column fuse set is not present.

The fail mode analysis circuit 180 may re-correct the repair mode selection signal XY_SEL, and thus output the re-corrected result to the row/column fuse set register 230 and the data control circuit 300. For example, if the repair mode selection signal XY_SEL is at a low level, the row repair mode is established so that the row redundancy cell is used. In contrast, if the repair mode selection signal XY_SEL is at a high level, the column repair mode is established so that the column redundancy cell is used.

A method for analyzing the fail mode of the first selected fail, a method for selecting an appropriate fuse set, and a repair method according to the embodiments will hereinafter be described in detail.

If a bit fail occurs, the redundancy control signal XY_PRIORITY applied to the fail mode analysis circuit 180 is at a low level (row priority), and the row multi-bit signal ROWMBIT and the column multi-bit signal COLMBIT are at a low level. If the row fuse nonuse signal RF_OVERFLOW is at a high level (indicating the presence of the unused row fuse set), the repair mode selection signal XY_SEL is at a low level. However, if the row fuse nonuse signal RF_OVERFLOW is at a low level (indicating the absence of an unused row fuse set), the repair mode selection signal XY_SEL is at a high level.

If a bit fail occurs, the redundancy control signal XY_PRIORITY applied to the fail mode analysis circuit 180 is at a high level (column priority), the row multi-bit signal ROWMBIT and the column multi-bit signal COLMBIT are at a low level. If the column fuse nonuse signal CF_OVERFLOW is at a high level (indicating the presence of an unused column fuse set), the repair mode selection signal XY_SEL is at a high level. However, if the column fuse nonuse signal CF_OVERFLOW is at a low level (indicating the absence of an unused column fuse set), the repair mode selection signal XY_SEL is at a low level.

As described above, if the bit fail occurs, the repair operation is carried out using the row or column redundancy. If the bit fail occurs, the row repair is repaired with priority. That is, the repair operation is carried out using the row redundancy. If the row redundancy is not present, the column redundancy is used.

In addition, if the row-oriented fail occurs, the row multi-bit signal ROWMBIT is at a high level and the column multi-bit signal COLMBIT is at a low level. In this case, if the row fuse nonuse signal RF_OVERFLOW is at a high level irrespective of the logic level of the redundancy control signal XY_PRIORITY, the repair mode selection signal XY_SEL is mandatorily output at a low level. If the row fuse nonuse signal RF_OVERFLOW is at a low level, the repair mode selection signal XY_SEL is output at a high level. As described above, if the row-oriented fail occurs, the repair operation is carried out using the row redundancy.

In addition, if the column-oriented fail occurs, the row multi-bit signal ROWMBIT is at a low level and the column multi-bit signal COLMBIT is at a high level. In this case, if the column fuse nonuse signal CF_OVERFLOW is at a high level irrespective of the logic level of the redundancy control signal XY_PRIORITY, the repair mode selection signal XY_SEL is mandatorily output at a high level. If the column fuse nonuse signal CF_OVERFLOW is at a low level, the repair mode selection signal XY_SEL is output at a low level. As described above, if the column fail occurs, the repair operation is carried out using the column redundancy.

In addition, if the cluster-oriented fail occurs, the row multi-bit signal ROWMBIT and the column multi-bit signal COLMBIT are at a high level. If the cluster-oriented fail occurs, the repair operation is performed in the same manner as in the above-mentioned bit-oriented fail.

The operations of the 3 mat self-repair modes will hereinafter be described. That is, if the fail mode signal XY_SELFIX is at a low level, the repair mode selection signal XY_SEL may operate as described above. In contrast, if the fail mode signal XY_SELFIX is at a high level, the repair mode selection signal XY_SEL is mandatorily output at a high level.

The row/column fuse set register 230 may select the row fuse set or the column fuse set upon receiving the repair mode selection signal XY_SEL, and thus output the fuse set signals FS<0:K>. For example, if the repair mode selection signal XY_SEL is at a low level, the row fuse set is selected. If the repair mode selection signal XY_SEL is at a high level, the column fuse set is selected.

In addition, the row/column fuse set register 230 may output the unused fuse signal OVERFLOW obtained by combining the row fuse nonuse signal RF_OVERFLOW and the column fuse nonuse signal CF_OVERFLOW to the rupture control circuit 400. For example, if the repair mode selection signal XY_SEL is at a low level, the row fuse nonuse signal RF_OVERFLOW is enabled. If the repair mode selection signal XY_SEL is at a high level, the column fuse nonuse signal CF_OVERFLOW is enabled. If both the row fuse nonuse signal RF_OVERFLOW and the column fuse nonuse signal CF_OVERFLOW are at a low level, the unused fuse signal OVERFLOW is at a low level.

In addition, if the fail mode signal XY_SELFIX is at a high level, the row/column fuse set register 230 may select the column fuse set. If the fail mode signal XY_SELFIX is at a low level, the row/column fuse set register 230 may output the fuse set selected by the above operation using the fuse set signals FS<0:K>.

If any one of the row fuse nonuse signal RF_OVERFLOW and the column fuse nonuse signal CF_OVERFLOW is at a high level, the unused fuse signal OVERFLOW is at a high level. Assuming that the repair operation is performed on the condition that the unused fuse signal OVERFLOW is at a low level, the actual repair operation is not performed because the unused fuse set is not present in the row fail region and the column fail region.

The data control circuit 300 may combine the repair mode selection signal XY_SEL and the self-rupture signal SELFRUP, may select some parts of the memory repair data MRD<0:M>, the bank signals BK<0:2>, the fail row addresses RA<1:14>, the fail column addresses CA<3:9>, the fuse set signals FS<0:k>, and the mat selection signals SMAT<0:5>, and may output the bank addresses BANK<0:2>, the addresses ADD<0:N>, and the fuse signals FUSE_SET<0:k> to the fuse array 500.

For example, if the self-rupture signal SELFRUP is at a high level and the repair mode selection signal XY_SEL is at a low level, the bank signals BK<0:2>, the fail row addresses RA<1:14>, and the fuse set signals FS<0:k> are selected, so that the bank addresses BANK<0:2>, the addresses ADD<0:N>, and the fuse signals FUSE_SET<0:k> are output to the fuse array 500 (in the case of performing the row repair operation).

If the self-rupture signal SELFRUP and the repair mode selection signal XY_SEL are at a high level, the bank signals BK<0:2>, the mat selection signals SMAT<0:5>, the fail column addresses CA<3:9>, and the fuse set signals FS<0:k> are selected, such that the bank addresses BANK<0:2>, the addresses ADD<0:N>, and the fuse signals FUSE_SET<0:k> are output to the fuse array 500 (in the case of performing the column repair operation).

In addition, if the self-rupture signal SELFRUP is at a low level, the memory repair data MRD<0:M> is selected irrespective of the repair mode selection signal XY_SEL, such that the bank addresses BANK<0:2>, the addresses ADD<0:N>, and the fuse signals FUSE_SET<0:k> are output to the fuse array 500. The case in which the memory repair data MRD<0:M> is selected may indicate the repair information is received from the external part such that the repairing toward the normal repair mode is performed on the wafer.

Subsequently, if the rupture enable signal RUPTURE_EN is enabled to perform the repair operation, the clock signal CLK and the unused fuse signal OVERFLOW are combined by the rupture control circuit 400, such that the rupture control signals RUP_CTRL<0:S> are output to the fuse array 500. As a result, the fuse array 500 may search for the corresponding fuse set on the basis of the pre-transmitted bank addresses BANK<0:2>, the addresses ADD<0:N>, and the fuse signals FUSE_SET<0:k>, and may select the fuses corresponding to the bits of the addresses ADD<0:N> one by one and then perform the repair operation.

The method for analyzing the fail modes stored in the second row/column address register 110 and the repair process according to the embodiment will hereinafter be described below.

If the selection signal SEL<1> is activated, the selection circuit 150 selects the second row/column address register 110, such that the bank signals BK<0:2>, the fail row addresses RA<1:14>, the fail column addresses CA<3:9>, the mat signals MAT<0:5>, and the column region identification signal OCT are output to the fail region search circuit 220. The selection circuit 140 may select the second multi-bit counter 130, and thus output the row multi-bit signal ROWMBIT and the column multi-bit signal COLMBIT to the fail mode analysis circuit 180. Thereafter, the analysis process of the fail mode analysis circuit 180 and the repair process of the fail mode are repeatedly performed.

Finally, the method for analyzing the fail modes stored in the third row/column address register 110 and the repair process for the same will hereinafter be described below.

If the selection signal SEL<2> is activated, the selection circuit 150 may select the third row/column address register 110, and thus output the bank signals BK<0:2>, the fail row addresses RA<1:14>, the fail column addresses CA<3:9>, the mat signals MAT<0:5>, and the column region identification signal OCT to the fail region search circuit 220. The selection circuit 140 may select the third multi-bit counter 130, and thus output the row multi-bit signal ROWMBIT and the column multi-bit signal COLMBIT to the fail mode analysis circuit 180. Thereafter, the analysis process of the above-mentioned fail mode analysis circuit 180 and the repair process are repeatedly performed.

As described above, the embodiments of the present disclosure can automatically select the row or column redundancy according to various fail modes generated in the package, and can optimally perform the repair operation, such that the package yield (or productivity) can be increased and the yield ramp-up time can be reduced.

Figure 10:
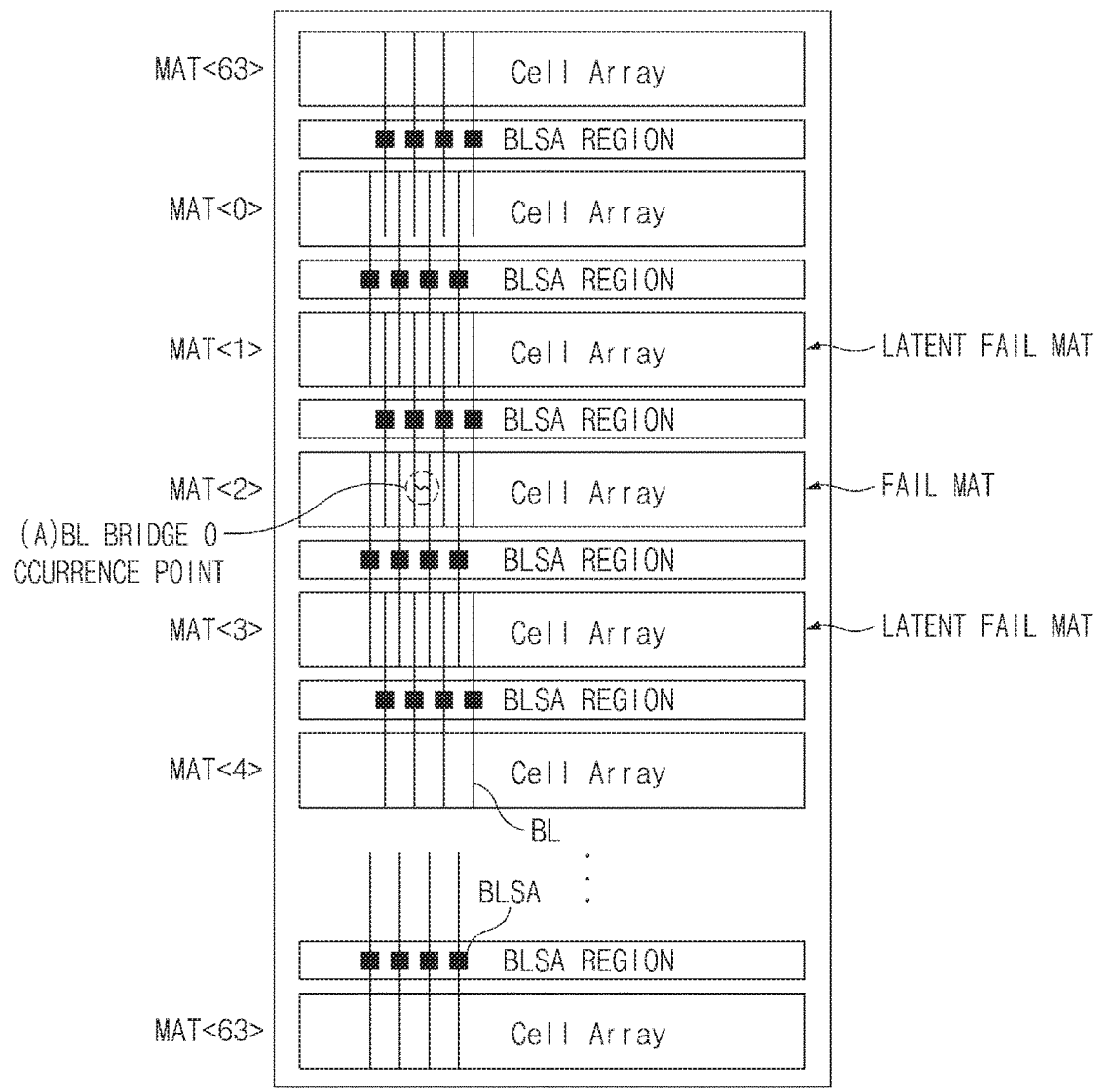
FIG. 10 is a configuration diagram illustrating mats according to an embodiment of the present disclosure.

FIG. 10 is a configuration diagram illustrating mats according to an embodiment of the present disclosure.

Referring to FIG. 10, if, for example, a bridge occurs in the bit line BL of the DRAM, a fail or defective part occurs in the mat including the bridge as illustrated in the part (A). In addition, neighbor mats sharing the bit line sense amplifier (BLSA) may have a fail or defective part, or there is a high possibility of generating the fail or defective part in the neighboring mats.

However, according to the conventional self-repair scheme, only the defective mat caused by the bit line (BL) bridge is repaired. The neighbor mats (i.e., mats sharing the BLSA) in which a fail or defective part is latent (or dormant) are not repaired such that an unexpected quality problem occurs. Therefore, according to the embodiments, the target mat including a fail or defective part and other mats in which the fail or defective part is latent can be repaired, resulting in increased quality.

It is assumed that the mat located at the center part from among the plurality of mats (MATs) is a fail or defective mat as illustrated in (A). The mat located above the defective mat may share, along with the defective mat, the bit line sense amplifier (BLSA). The mat located below the defective mat may share, along with the defective mat, the bit line sense amplifier (BLSA).

If the fail mode signal XY_SELFIX is at a low level, this means that the fail mode indicates the row-oriented fail, the cluster-oriented fail, or the bit-oriented fail, such that only the target defective mat is repaired using the row redundancy cell. In contrast, if the fail mode signal XY_SELFIX is at a high level, this means that the fail mode indicates the column-oriented fail, such that the repair operation is performed using the column redundant cell.

In this case, if the upper selection signal TECFUPREG is enabled, the upper mat is repaired. If the lower selection signal TECFDNREG is enabled, the lower mat is repaired. If the upper selection signal TECFUPREG and the lower selection signal TECFDNREG are disabled, the fail mat corresponding to the target mat is repaired.

As is apparent from the above description, according to various embodiments, since repair may be optimally performed by automatically selecting row or column redundancies according to various fail modes occurring in a package, it is possible to contribute to improvement of a package yield and shorten a yield ramp-up time.

Figure 11:
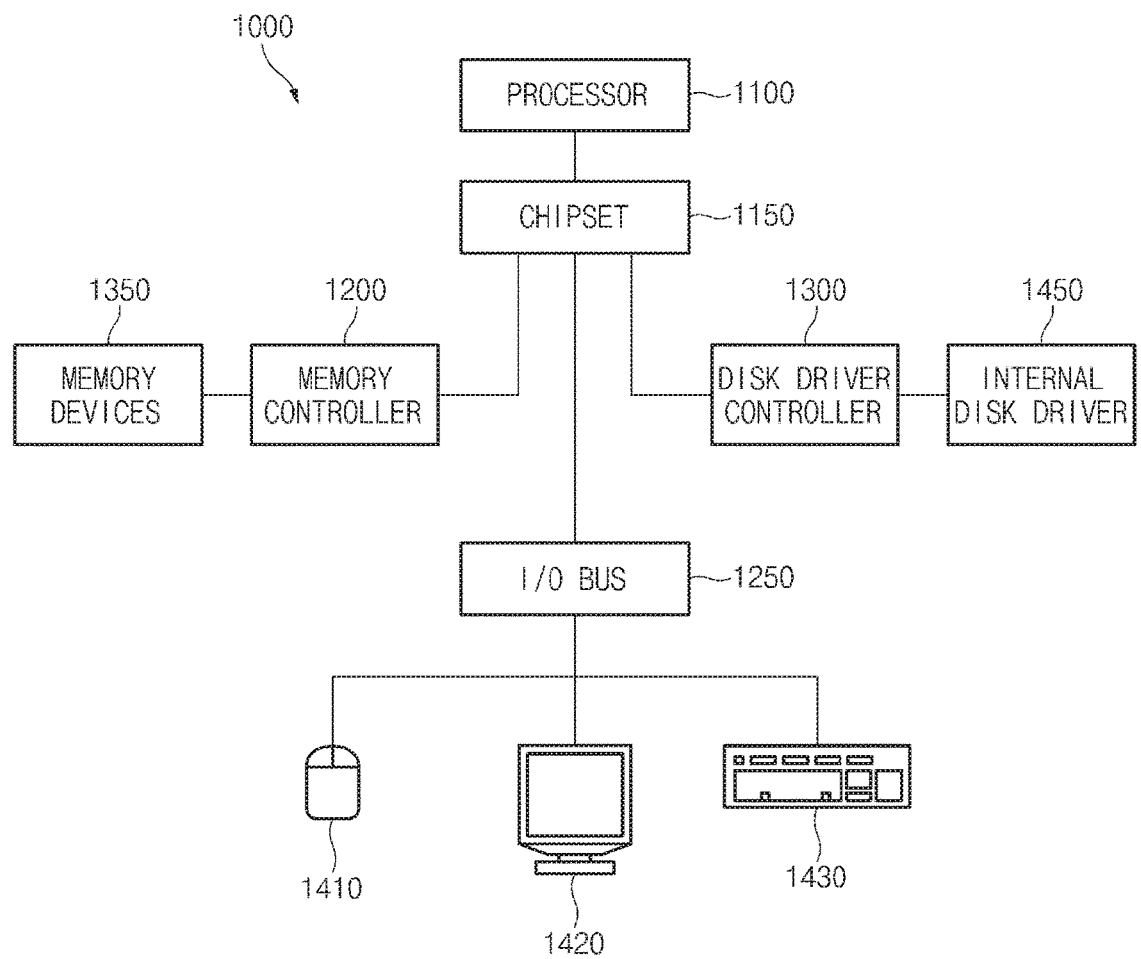
FIG. 11 illustrates a block diagram of an example of a representation of a system employing a smart self-repair device and/or method of self-repairing a package with the various embodiments discussed above with relation to FIGS. 1-10.

The smart self-repair device and/or method of self-repairing a package as discussed above (see FIGS. 1-10) are particular useful in the design of memory devices, processors, and computer systems. For example, referring to FIG. 11, a block diagram of a system employing a smart self-repair device and/or method of self-repairing a package in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one smart self-repair device and/or method of self-repairing a package as discussed above with reference to FIGS. 1-10. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one smart self-repair device and/or method of self-repairing a package as discussed above with relation to FIGS. 1-10, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 11 is merely one example of a system 1000 employing a smart self-repair device and/or method of self-repairing a package as discussed above with relation to FIGS. 1-10. In alternate embodiments, such as, for example but not limited to, cellular phones or digital cameras, the components may differ from the embodiments illustrated in FIG. 11.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A smart self-repair device comprising:
   a fuse array configured to store information regarding respective bits of a fail address in fuses;
   a self-repair control circuit configured to control repairing of not only a target mat in which a fail occurs, but also adjacent upper and lower mats sharing a sense amplifier along with the target mat, and to output fail address information corresponding to a fail mode, and row fuse set information or a column fuse set information;
   a data control circuit configured to output repair information to the fuse array based on the fail address information and the row fuse set information or the column fuse set information;
   a control circuit configured to control a rupture operation of the fuse array; and
   an oscillation circuit configured to output a clock signal to the self-repair control circuit based on a boot-up enable signal and a rupture enable signal.

2. The smart self-repair device according to claim 1, wherein:
   the upper mat is located at an upper part on the basis of the target mat, shares a bit line sense amplifier (BLSA) along with the target mat; and
   the lower mat is located at a lower part on the basis of the target mat, shares a bit line sense amplifier (BLSA) along with the target mat.

3. The smart self-repair device according to claim 1, wherein the self-repair control circuit includes:
   a repair selection circuit configured to store a row address and a column address corresponding to a fail bit, analyze the fail mode by comparing the fail address received during a test with a pre-stored address, and output a fail mode signal corresponding to a mat address; and
   a fuse set selection circuit configured to output the fail address information, and the row fuse set information or the column fuse set information based on the fail mode, and output a mat selection signal for selecting any one of the target mat, the upper mat, and the lower mat.

4. The smart self-repair device according to claim 3, wherein the repair selection circuit includes:
   at least one row/column address register configured to, when the fail occurs, sequentially store the row address and the column address corresponding to different fail bits, and output a mat signal based on a mat address and a fail region identification signal;
   at least one address comparison circuit configured to compare a fail address of a fail cell additionally received during the test with an address pre-stored in the row/column address register; and
   at least one multi-bit counter configured to count an output signal of the address comparison circuit; and
   a fail mode analysis circuit configured to, upon completion of the test, analyze the fail mode of a fail address stored in the row/column address register based on the output signals of the multi-bit counter, output a repair mode selection signal according to the analyzed result, and output the fail mode signal based on the mat address.

5. The smart self-repair device according to claim 4, wherein:
   if the fail mode signal is at a low level, the fail mode analysis circuit repairs the target mat; and
   if the fail mode signal is at a high level, the fail mode analysis circuit sequentially repairs the upper mat, the lower mat, and the target mat.

6. The smart self-repair device according to claim 4, wherein:
   upon receiving the output signals of the multi-bit counters, a self rupture signal, a redundancy control signal, a row redundancy selection signal, a column redundancy selection signal, and a row/column fuse nonuse signal, the fail mode analysis circuit outputs the repair mode selection signal and the fail mode signal for performing a row redundancy or a column redundancy to the data control circuit.

7. The smart self-repair device according to claim 4, wherein:
   upon receiving the output signals of the multi-bit counters, a redundancy control signal, a row redundancy selection signal, a column redundancy selection signal, and a row/column fuse nonuse signal, the fail mode analysis circuit determines whether a bit-oriented fail, a column-oriented fail, a row-oriented fail, or a cluster-oriented fail occurs.

8. The smart self-repair device according to claim 4, wherein the fail mode analysis circuit includes:
   a selection signal generation circuit configured to perform a logic operation among a row multi-bit signal and a column multi-bit signal received from the multi-bit counters, a row redundancy selection signal, a column redundancy selection signal, and a rupture signal, and output the fail mode signal; and
   a control signal generation circuit configured to perform another logic operation among the row multi-bit signal, the column multi-bit signal, a row fuse nonuse signal, a column fuse nonuse signal, and a redundancy control signal, and generate the repair mode selection signal.

9. The smart self-repair device according to claim 8, wherein:
   if a row-oriented fail, a cluster-oriented fail, and a bit-oriented fail occur, the fail mode signal is at a low level, only the target mat is repaired; and
   if a column-oriented fail occurs, the fail mode signal is at a high level, the upper mat, the lower mat, and the target mat are repaired.

10. The smart self-repair device according to claim 4, wherein the row/column address register receives a mat address, a bank address, a row address and a column address of a failed memory cell, and a fail region identification signal, and sequentially stores the row address and the column address in a plurality of registers according to a storage signal.

11. The smart self-repair device according to claim 4, wherein the multi-bit counters increase a count value when comparison results of the address comparison circuits are identical to each other.

12. The smart self-repair device according to claim 4, wherein the repair selection circuit includes:
- a first selection circuit configured to select any one of the output signals of the row/column address registers based on a selection signal; and
- a second selection circuit configured to select any one of the output signals of the multi-bit counters based on the selection circuit, and output the selected signal to the fail mode analysis circuit.

13. The smart self-repair device according to claim 3, wherein the fuse set selection circuit includes:
- a fail region search circuit configured to search for a row address fail region and a column address fail region based on the output signal of the repair selection circuit, and output mat information to be repaired; and
- a row/column fuse set register configured to store unused fuse set information, and output a mat selection signal to be repaired to the data control circuit based on an upper selection signal for selecting the upper mat and a lower selection signal for selecting the lower mat.

14. The smart self-repair device according to claim 13, wherein the fuse set selection circuit further includes:
- a counter configured to count a clock signal, and output the count signal to the fail region search circuit, the row/column fuse set register, the rupture control circuit, and the fuse array.

15. The smart self-repair device according to claim 13, wherein the fail region search circuit includes:
- an adder configured to increase a mat signal and output the increased result;
- a subtractor configured to reduce the mat signal and output the reduced result;
- a row fail region search circuit configured to output a row region signal based on a bank signal, a row address, and a count signal;
- a column fail region search circuit configured to output a column region signal based on the bank signal, the mat signal, a column region identification signal, and the count signal;
- an upper region search circuit configured to output an upper region signal and the upper mat selection signal based on the bank signal, an output signal of the adder, the column region identification signal, and the count signal; and
- a lower region search circuit configured to output a lower region signal and the lower mat selection signal based on the bank signal, an output signal of the subtractor, the column region identification signal, and the count signal.

16. The smart self-repair device according to claim 13, wherein:
- the row/column fuse set register receives a row region signal, a column region signal, and a clock signal from the fail region search circuit, receives a row fuse set signal and a column fuse set signal from the fuse array, receives the repair mode selection signal, an upper region signal, a lower region signal, a mat signal, an upper mat selection signal, a lower mat selection signal, a count signal, the upper selection signal, the lower selection signal, and the repair mode selection signal; and
- the row/column fuse set register outputs a row fuse nonuse signal and a column fuse nonuse signal to the fail mode analysis circuit, outputs a fuse set signal to the data control circuit, and outputs an unused fuse signal and the mat selection signal to the rupture control circuit.

17. The smart self-repair device according to claim 13, wherein the row/column fuse set register includes:
- a row/column fuse set strobe generation circuit configured to receives a clock signal and a row/column fuse set signal, and output a row/column fuse set latch signal for storing fuse information in a row/column fuse set;
- a plurality of combination circuits configured to combine an output signal of the row/column fuse set strobe generation circuit with a row region signal, a column region signal, an upper region signal, and a lower region signal, and output a row/column latch signal, an upper latch signal, and a lower latch signal; and
- a row/column fuse set latch circuit configured to receive output signals of the plurality of combination circuits, a count signal, a row/column selection signal, an upper selection signal, and a lower selection signal, store unused row/column fuse set information, and output a row fuse signal, a column fuse set signal, an upper fuse set signal, and a lower fuse set signal; and
- a latch circuit configured to latch an output signal of the row/column fuse set latch circuit, and output a fuse set signal.

18. The smart self-repair device according to claim 17, wherein the column fuse set latch circuit includes:
- a plurality of fuse set latch circuits configured to receive output signals of the plurality of combination circuits, the count signal, the column selection signal, the upper selection signal, and the lower selection signal, and output the column fuse set signal, the upper fuse set signal, and the lower fuse set signal.

19. The smart self-repair device according to claim 13, wherein the row/column fuse set register includes:
- a fuse set selection circuit configured to receive the repair mode selection signal, the upper selection signal, and the lower selection signal, and output a row selection signal, a column selection signal, and a selection signal for selecting the upper mat and the lower mat;
- an overflow selection circuit configured to output a signal indicating the presence or absence of a row/column fuse set based on not only an output signal of the fuse set selection circuit and a row latch signal but also an output signal of a column latch signal; and
- a mat address selection circuit configured to receive an output signal of the fuse set selection circuit, a mat signal, an upper mat selection signal, and a lower mat selection signal, and output a mat selection signal.

20. A method of self-repairing a package comprising:
- storing information regarding respective bits of a fail address in fuses;
- controlling a repair of not only a target mat in which a fail occurs, bit also adjacent upper and lower mats sharing a sense amplifier along with the target mat, and to output fail address information corresponding to a fail mode, and row fuse set information or a column fuse set information;
- outputting repair information to the fuse array based on the fail address information and the row fuse set information or the column fuse set information;
- controlling a rupture operation of the fuse array;
- storing a row address and a column address corresponding to a fail bit;
- analyzing the fail mode by comparing the fail address received during a test with a pre-stored address;
- outputting a fail mode signal corresponding to a mat address;

outputting the fail address information, and the row fuse set information or the column fuse set information based on the fail mode; and outputting a mat selection signal for selecting any one of the target mat, the upper mat, and the lower mat.

21. The method of claim 20, further comprising:

sequentially storing, when the fail occurs, the row address and the column address corresponding to different fail bits, and outputting a mat signal based on a mat address and a fail region identification signal;

comparing, with at least one address comparison circuit, a fail address of a fail cell additionally received during the test with an address pre-stored in a row/column address register;

counting, with a multi-bit counter, an output signal of the address comparison circuit; and upon completion of the test, analyzing the fail mode of a fail address stored in the row/column address register based on the output signals of the multi-bit counter, outputting a repair mode selection signal according to the analyzed result, and outputting the fail mode signal based on the mat address.

22. The method of claim 21, wherein:

if the fail mode signal is at a first level, the target mat is repaired; and if the fail mode signal is at a second level, the upper mat, the lower mat, and the target mat are sequentially repaired.

23. The method of claim 21, wherein upon receiving the output signals of the multi-bit counters, a redundancy control signal, a row redundancy selection signal, a column redundancy selection signal, and a row/column fuse nonuse signal:

determining whether a bit-oriented fail, a column-oriented fail, a row-oriented fail, or a cluster-oriented fail occurred.

24. The method of claim 23, wherein:

if the row-oriented fail, the cluster-oriented fail, and the bit-oriented fail occur, then only the target mat is repaired; and if the column-oriented fail occurs, then the upper mat, the lower mat, and the target mat are repaired.

25. The method of claim 21, further comprising:

increasing, with the multi-bit counters, a count value when comparison results of the address comparison circuits are identical to each other.

26. The method of claim 20, further comprising:

searching for a row address fail region and a column address fail region, and outputting mat information to be repaired, and storing unused fuse set information, and outputting a mat selection signal to be prepared based on an upper selection signal for selecting the upper mat and a lower selection signal for selecting the lower mat.

* * * * *